(12) United States Patent
Suzuki et al.

(10) Patent No.: US 6,497,783 B1
(45) Date of Patent: *Dec. 24, 2002

(54) PLASMA PROCESSING APPARATUS PROVIDED WITH MICROWAVE APPLICATOR HAVING ANNULAR WAVEGUIDE AND PROCESSING METHOD

(75) Inventors: Nobumasa Suzuki, Yokohama (JP); Manabu Matsuo, Chiba (JP); Hirohisa Oda, Utsunomiya (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/082,006

(22) Filed: May 20, 1998

(30) Foreign Application Priority Data

May 22, 1997 (JP) ............................... 9-132385
May 22, 1997 (JP) ............................... 9-132386

(51) Int. Cl.$^7$ ......................................... H01L 21/3065
(52) U.S. Cl. .............. 156/345; 156/345.34; 156/345.41
(58) Field of Search ................................. 438/707, 710, 438/708, 709, 728; 156/345, 345.34, 345.41; 219/121.43; 118/723 MW; 216/58

(56) References Cited

U.S. PATENT DOCUMENTS

| 4,776,918 A | | 10/1988 | Otsubo et al. ............... 156/345 |
|---|---|---|---|
| 4,985,109 A | | 1/1991 | Otsubo et al. ............... 156/345 |
| 5,034,086 A | | 7/1991 | Sato ........................... 156/345 |
| 5,134,965 A | * | 8/1992 | Tokuda et al. ............... 118/723 |
| 5,359,177 A | * | 10/1994 | Taki et al. ............... 219/121.43 |
| 5,487,875 A | | 1/1996 | Suzuki .................. 422/186.05 |
| 5,517,085 A | * | 5/1996 | Engemann et al. ...... 315/111.21 |
| 5,520,771 A | * | 5/1996 | Kanai et al. ................. 156/345 |
| 5,538,699 A | * | 7/1996 | Suzuki .................. 422/186.29 |
| 5,698,036 A | * | 12/1997 | Ishii et al. .................. 118/723 |
| 5,846,612 A | * | 12/1998 | Takaki et al. ............... 427/569 |
| 5,861,601 A | * | 1/1999 | Sato et al. .............. 219/121.43 |

FOREIGN PATENT DOCUMENTS

| DE | 4311360 | 10/1994 |
|---|---|---|
| EP | 0264913 | 4/1988 |
| EP | 0564359 | 10/1993 |
| JP | 59-125628 | 7/1984 |
| JP | 63-103088 | 5/1988 |
| JP | 63-293825 | 11/1988 |
| JP | 2-209484 | 8/1990 |
| JP | 3-19332 | 1/1991 |
| JP | 5-290995 | 11/1993 |
| JP | 5-345982 | 12/1993 |
| JP | 7-90591 | 4/1995 |

* cited by examiner

Primary Examiner—Benjamin L. Utech
Assistant Examiner—Lan Vinh
(74) Attorney, Agent, or Firm—Fitzpatrick, Cella, Harper & Scinto

(57) ABSTRACT

A plasma processing apparatus is disclosed which comprises a container which can be evacuated; a gas supply means for supplying a gas to the inside of the container; and a microwave supply means for supplying microwaves to generate a plasma in the container, the plasma being utilized to process an article, wherein the microwave supply means is a microwave applicator which is provided with an annular waveguide having a planar H-plane with a plurality of slots provided apart from each other and a rectangular cross section perpendicular to the traveling direction of microwaves and which supplies microwaves to the inside of the container through a dielectric window of the container from the plurality of slots provided in the planar H-plane, and wherein the gas supply means is provided a gas emission port through which the gas is emitted toward the planar H-plane.

26 Claims, 25 Drawing Sheets

PLASMA PROCESSING APPARATUS PROVIDED WITH MICROWAVE APPLICATOR HAVING ANNULAR WAVEGUIDE AND PROCESSING METHOD

BACKGROUND OF THE INVENTION

1. Field of the Invention

The present invention relates to a plasma processing apparatus for applying plasma processing to an article to be processed (hereinafter, simply referred to as "article" as occasion demands) using microwaves, and more particularly to a microwave applicator having an annular (or circular) waveguide, a plasma processing apparatus provided therewith, a microwave applicator having a multiple annular waveguide, and a plasma processing apparatus provided therewith.

2. Related Background Art

As plasma processing apparatuses that use microwaves as an excitation source for plasma generation, there have been known the plasma polymerizing apparatus, the CVD apparatus, the surface modifying apparatus, the etching apparatus, the ashing apparatus, and the cleaning apparatus and the like.

The CVD using such a so-called microwave plasma processing apparatus is carried out, for example, as follows. A gas is introduced into a plasma generation chamber and/or a film formation chamber of a microwave plasma CVD apparatus, and a microwave energy is simultaneously applied to generate a plasma in the plasma generation chamber to excite and/or decompose the gas, thereby forming a deposited film on an article to be processed disposed in the plasma generation chamber or film formation chamber. Further, a similar method can be used to carry out plasma polymerization of an organic substance or surface modification such as oxidation, nitridation or fluorination.

Furthermore, the etching using a microwave plasma etching apparatus is carried out, for example, as follows. An etchant gas is introduced into a processing chamber of the apparatus, and a microwave energy is simultaneously applied to excite and/or decompose the etchant gas to generate a plasma in the processing chamber, thereby etching the surface of an article to be processed disposed in the processing chamber.

In addition, the ashing using a microwave plasma ashing apparatus is carried out, for example, as follows. An ashing gas is introduced into a processing chamber in the apparatus, and a microwave energy is simultaneously applied to excite and/or decompose the ashing gas in order to generate a plasma in the processing chamber, thereby ashing the surface of an article to be processed, namely a photoresist disposed in the processing chamber. As with the ashing, it is possible to effect cleaning for removing unwanted matter deposited on a to-be-processed surface of an article to be processed.

In the microwave plasma processing apparatus, since microwaves are used as a gas excitation source, electrons can be accelerated by an electric field having a high frequency, thereby efficiently ionizing and excite gas molecules. Thus, the microwave plasma processing apparatus is advantageous in that the efficiency of ionization, excitation, and decomposition of a gas is high, so that a high density plasma can relatively easily be formed, thereby enabling fast processing at a low temperature to provide high quality. In addition, since the microwaves have a property of penetrating a dielectric member, the plasma processing apparatus can be constituted as a electrodeless discharge type, whereby highly clean plasma processing can be carried out.

To increase the processing speed of the microwave plasma processing apparatus, plasma processing apparatuses using electron cyclotron resonance (ECR) have been put to practical use. The ECR is a phenomenon in which when the magnetic flux density is 87.5 mT, the electron cyclotron frequency for electrons rotating around the magnetic line of force is brought into conformity with the general frequency of the microwaves of 2.45 GHz, whereby the electrons resonantly absorb microwaves to be accelerated, thereby generating a high density plasma. As to such an ECR plasma processing apparatus, the following four typical configurations for a microwave introducing means and a magnetic-field generating means are known.

In a first configuration (i), microwaves propagated via a waveguide are introduced into a cylindrical plasma generation chamber from a surface opposed to an article to be processed through a transmissive window, and a divergent magnetic field coaxial with the central axis of the plasma generation chamber is introduced via an electromagnetic coil provided at the periphery of the plasma generation chamber. In a second configuration (ii), microwaves transmitted via a waveguide are introduced into a bell-shaped plasma generation chamber from a surface opposed to an article to be processed, and a magnetic field coaxial with the central axis of the plasma generation chamber is introduced via an electromagnetic coil provided at the periphery of the plasma generation chamber. In a third configuration (iii), microwaves are introduced into a plasma generation chamber from its periphery via a coil that is a kind of a cylindrical slot antenna, and a magnetic field coaxial with the central axis of the plasma generation chamber is introduced via an electromagnetic coil provided at the periphery of the plasma generation chamber. In a fourth configuration (iv), microwaves transmitted via a waveguide are introduced into a cylindrical plasma generation chamber from a surface opposed to an article to be processed via a planar slot antenna, and a loop-like magnetic field parallel to the antenna plane is introduced via a permanent magnet provided on the rear surface of the planar antenna (planar slot antenna method).

Further, U.S. Pat. No. 5,034,086 discloses a plasma processing apparatus using a radial line slot antenna (RLSA).

In addition, Japanese Patent Application Laid-Open No. 5-290995, U.S. Pat. No. 5,359,177, and EP 0564359 disclose a plasma processing apparatus using an annular waveguide with terminals.

Separately, as an example of a microwave plasma processing apparatus, there has recently been proposed an apparatus using an annular waveguide in which a plurality of slots are formed on an inner side surface thereof as a device for uniform and efficient introduction of microwaves (Japanese Patent Application Laid-Open No. 5-345982; U.S. Pat. No. 5,538,699).

This microwave plasma processing apparatus is shown in FIG. 29 and a microwave supply means thereof is shown in FIG. 28.

Reference numeral 501 designates a plasma generation chamber; 502 is a dielectric window that separates the plasma generation chamber 501 from the atmosphere; 503 is a slotted endless annular waveguide with a cylindrical external shape for supplying microwaves to the plasma generation chamber 501; 505 is a plasma-generating gas supply means; 511 is a processing chamber connected to the plasma generation chamber 501; 512 is an article to be processed; 513 is a support for the article 512; 514 is a heater for heating the article 512; 515 is a processing gas supply means; 516 is an exhaust port; 521 is a block that distributes microwaves to the right and left; and 522 is a slot provided in a curved surface 523. In addition, 524 is a diaphragm and 525 is a microwave introducing port.

The generation of a plasma and the processing are carried out as follows.

The inside of the plasma generation chamber 501 and the processing chamber 511 is evacuated via an exhaust system (not shown). Subsequently, a plasma generating gas is introduced into the plasma generation chamber 501 at a predetermined flow rate via the gas supply port 505.

Then, a conductance valve (not shown) provided in the exhaust system (not shown) is adjusted to retain the inside of the plasma generation chamber 501 at a predetermined pressure. A desired power is supplied to the inside of the plasma generation chamber 501 from a microwave power source (not shown) via the annular waveguide 503.

On this occasion, the microwaves introduced into the annular waveguide 503 are distributed to the right and left by the distributing block 521 and propagate through the waveguide at a guide wavelength longer than a free-space wavelength. The microwaves are supplied from the slots 522 provided at an interval of ½ or ¼ of the guide wavelength, through the dielectric window 502 to the plasma generation chamber 501 to generate a plasma 527.

At this time, when a processing gas has been supplied into the processing chamber 511 via the processing gas supply pipe 515, the processing gas is excited by the high density plasma as generated to process a surface of the article to be processed 512 put on the support 513.

Since the use of such a microwave plasma processing apparatus can generate a high density, low potential plasma of a uniformity within ±3%, an electron density $10^{12}/cm^3$ or more, an electron temperature 3 eV or less, and a plasma potential 20V or less in a space of a diameter of about 200 mm at a microwave power of –1 kW or more, the gas can fully be reacted and supplied in an active state to the article to be processed and the surface damage due to incident ions of the article to be processed can be reduced, thereby enabling high quality and high speed processing even at low temperatures.

However, when the microwave plasma processing apparatus that generates a high density, low potential plasma as shown in FIGS. 28 and 29 is used to effect processing in a high pressure region at 100 mTorr (about 13.3322 Pa) or more, as in the case of the ashing processing, the diffusion of plasma is suppressed, so that the plasma may locally exist in the periphery of the chamber to reduce the processing speed for the center portion of the article to be processed.

Further, Japanese Patent Application Laid-Open No. 7-90591 discloses a plasma processing apparatus using a disc-like microwave introducing device. In this apparatus, a gas is introduced into a waveguide and emitted toward a plasma generation chamber through slots provided in the waveguide. In this apparatus, in order to prevent a plasma from being generated in the waveguide, the gas supply pressure, the conductance in the waveguide, the conductance of the slots, the exhaust pressure, and the like must be adjusted precisely. It is thus very difficult to design an apparatus that can be commonly used for any one of the CVD, etching, ashing, and so on the optimal pressures for which are different from one another.

In addition, for the processing of the surfaces of a 12-inch wafer (also called "300 mm wafer") of a diameter 305 mm, a glass substrate of an area equivalent thereto, and the like as required in recent years, a layer of a high density plasma is needed which is uniform, of a large area, and thin.

To provide such a plasma layer, the configuration of a gas supply means and/or the configuration of a microwave supply means need to be further improved.

SUMMARY OF THE INVENTION

A first object of the present invention is to provide a plasma processing apparatus and method that can perform various higher-quality plasma processing of higher quality at lower temperatures.

A second object of the present invention is to improve a gas supply means and to therefore provide a plasma processing apparatus and method that can generate a layer of a high density plasma which is uniform, of a large area, and thin, even when the processing is carried out in a region of a relatively high pressure.

A third object of the present invention is to provide a microwave applicator of a simple and inexpensive structure that can provide various microwave radiant intensity distributions.

A fourth object of the present invention is to improve a microwave supply means and to therefore provide a microwave applicator and a plasma processing apparatus and method that can generate a layer of a high density plasma which is uniform, of a large area, and thin.

A fifth object of the present invention is to provide a microwave applicator and a plasma processing apparatus and method that can plasma-process a large area article to be processed equivalent to a wafer of a diameter of 300 mm or more.

The gist of the present invention resides in a microwave applicator having a slot provided in the plane of an annular waveguide and a plasma processing apparatus and method using the same.

According to a first aspect of the present invention, there is provided a plasma processing apparatus comprising a container which can be evacuated; a gas supply means for supplying a gas to the inside of the container; and a microwave supply means for supplying microwaves to generate a plasma in the container, the plasma being utilized to process an article, wherein the microwave supply means is a microwave applicator which is provided with an annular waveguide having a planar H-plane with a plurality of slots provided apart from each other and a rectangular cross section perpendicular to the traveling direction of microwaves and which supplies microwaves to the inside of the container through a dielectric window of the container from the plurality of slots provided in the planar H-plane, and wherein the gas supply means is provided a gas emission port through which the gas is emitted toward the planar H-plane.

This configuration can generate a uniform, large-area, and low-temperature plasma even at a relatively high pressure, whereby a large-area article to be processed equivalent to a 8-inch or more wafer can be processed.

According to a second aspect of the present invention, there is provided a microwave applicator which is provided with an annular waveguide having a plane with a plurality of slots provided apart from each other and a rectangular cross section perpendicular to the traveling direction of microwaves and which supplies microwaves to the outside of the annular waveguide from the plurality of slots provided in the plane, wherein an assembly comprising a conductive member having an annular recessed portion and a microwave introducing port formed therein and a plate-like conductive member having the plurality of slots formed therein forms the annular waveguide in which the plane with the plurality of slots forms an H-plane.

This configuration enables a low-cost and highly universal microwave applicator to be manufactured.

According to a third aspect of the present invention, there is provided a plasma processing apparatus comprising a container which can be evacuated; a gas supply means for supplying a gas to the inside of the container; and a microwave supply means for supplying microwaves to generate a plasma in the container, the plasma being utilized to process an article, wherein the microwave supply means is a microwave applicator which is provided concentrically with a plurality of annular waveguides each having a planar H-plane with a plurality of slots provided apart from each other and a rectangular cross section perpendicular to the traveling direction of microwaves and which supplies microwaves to the inside of the container through a dielectric window of the container from the plurality of slots provided in the planar H-plane of each of the plurality of annular waveguides.

This configuration can generate a uniform, large-area, and low-temperature plasma regardless of flow of the gas, whereby a large-area article to be processed equivalent to a 12-inch or more wafer can be processed.

DETAILED DESCRIPTION OF THE PREFERRED EMBODIMENTS

Figure 1:
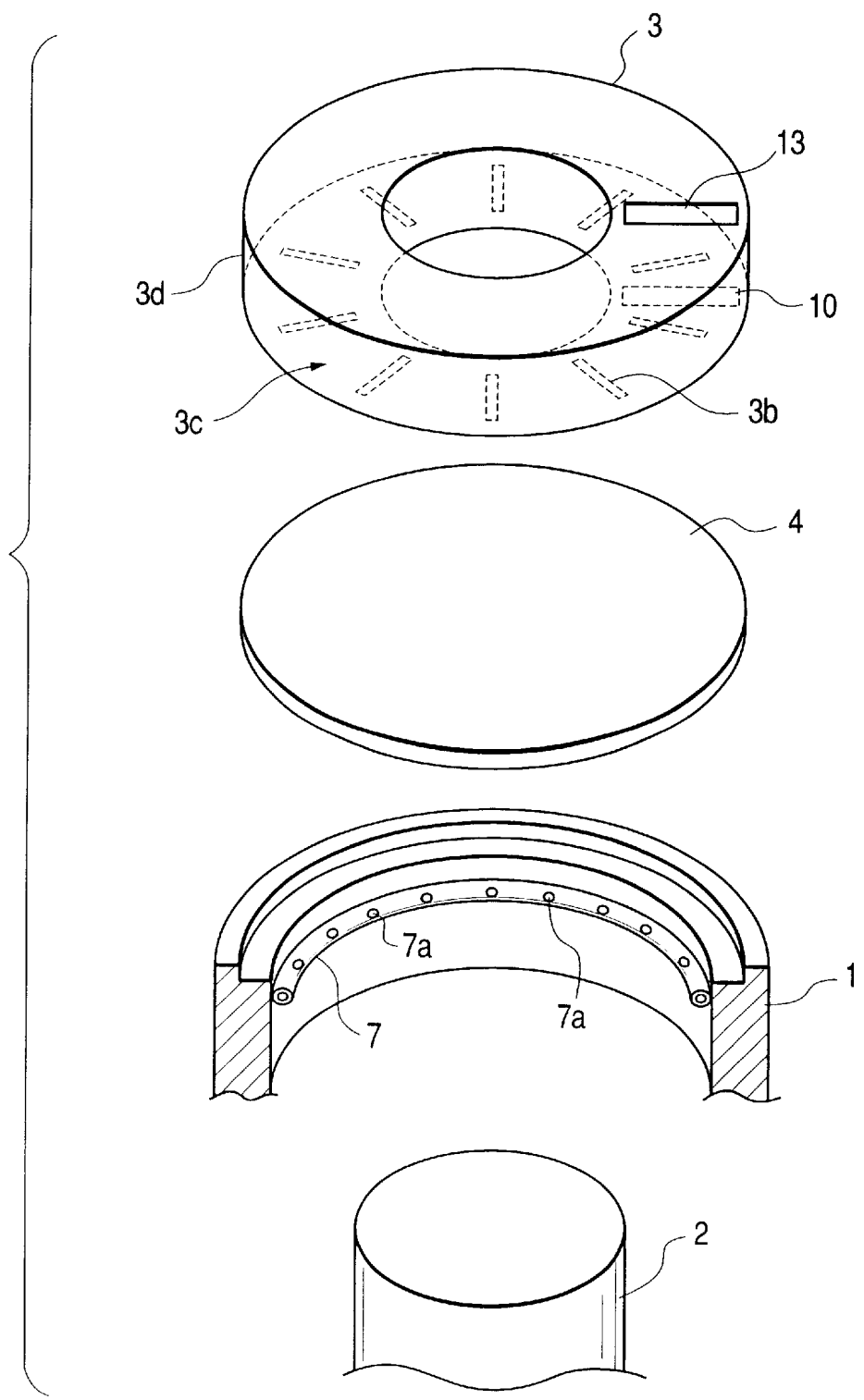
FIG. 1 is a schematic view showing the main components of a plasma processing apparatus according to a preferred embodiment of this invention.

FIG. 1 shows the main components of a plasma processing apparatus according to a preferred embodiment of this invention.

Reference numeral 1 designates a container (or vessel) which can be evacuated. The internal pressure of the container can be reduced.; 2 is a holding means for holding an article to be processed; 3 is a microwave supply means (also referred to as "microwave applicator" or "microwave antenna") for supplying microwaves used to generate a plasma in the container 1; 4 is a dielectric window; and 7 is a gas supply means for supplying a gas to the inside of the container 1.

Figure 2:
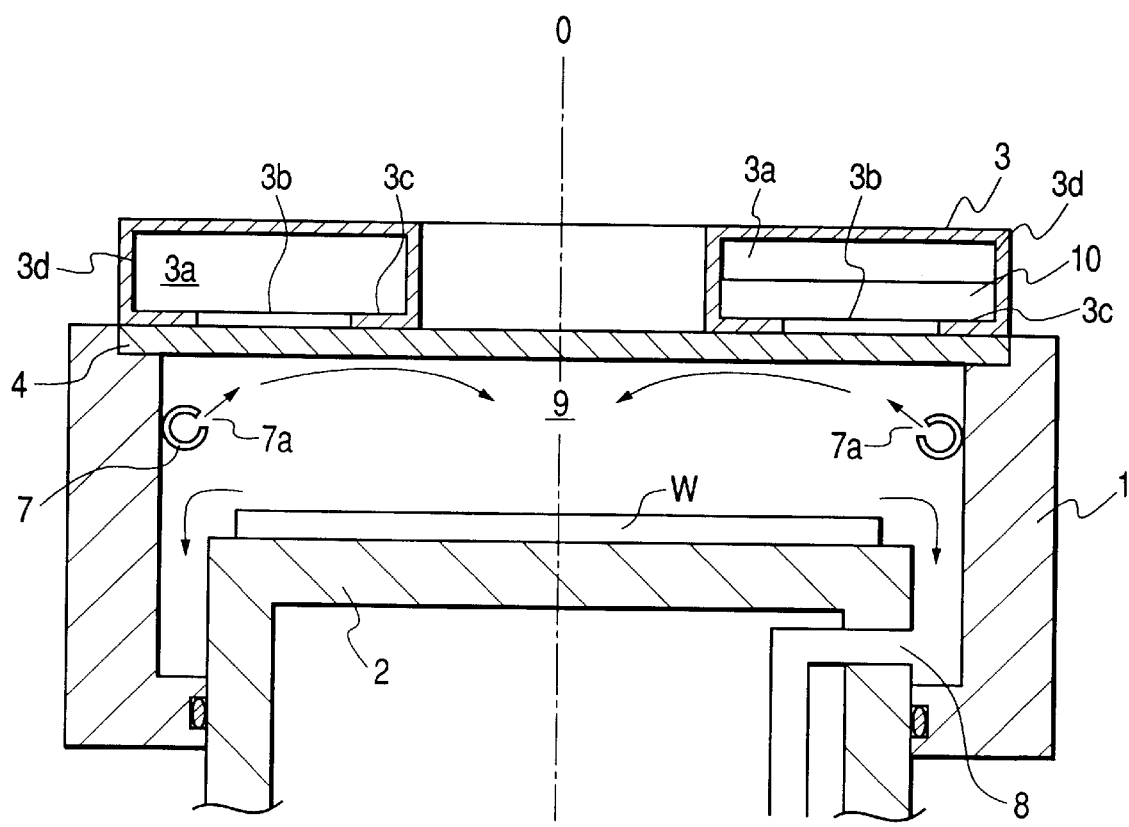
FIG. 2 is a schematic view showing a vertical cross section of the plasma processing apparatus according to the preferred embodiment of this invention.

FIG. 2 is a sectional view of a plasma processing apparatus configured using the components shown in FIG. 1.

The microwave applicator 3 is provided with an annular or circular waveguide 3a having an H-plane 3c with a plurality of slots 3b provided apart from each other and having a rectangular cross section perpendicular to the direction in which microwaves travel (the direction perpendicular to the drawing of FIG. 2).

Microwaves as introduced into the microwave applicator 3 through a microwave introducing port 13, propagate through the annular waveguide 3a after having their course changed by a distributor 10 such as an E branching block.

The annular waveguide 3a has a shape that appears to be formed by bending an E-plane of a single rectangular waveguide and connecting the both ends to each other.

While propagating and traveling through the annular waveguide 3a, the microwaves are radiated through the plurality of slots 3b provided in the bottom H-plane 3c.

The microwaves radiated through the slots 3b are transmitted through the dielectric window 4 located below the microwave applicator 3 and are supplied to the plasma generation space 9 in the container 1.

The plasma generation space 9 in the container 1 has its pressure reduced through exhaust by an exhaust means (not shown) in communication with an exhaust passage 8. In addition, a gas is emitted to the plasma generation space 9 through gas emission ports 7a of the gas supply means 7.

Consequently, the microwaves supplied to the plasma generation space 9 generate a glow discharge, thereby causing the component molecules of the gas to be ionized or converted into active species. Plasma generated appears like a donut below the slots or a layer (a disc) continuing from the bottom face of the H-plane.

The gas emission ports 7a of the gas supply means 7 are adapted to direct the gas toward the H-plane 3c of the annular waveguide 3a of the microwave applicator 3.

Thus, the gas emitted through the gas emission ports 7a advances to the vicinity of the center O of the microwave applicator 3 via a high density plasma region below the slots 3b.

Consequently, active species or ions of the gas are sufficiently supplied to the vicinity of the center O of the space 9 at which no slot 3b exists.

As a result, plasma processing can be uniformly applied to the whole of the to-be-processed surface of an article to be processed W.

Figure 3A:
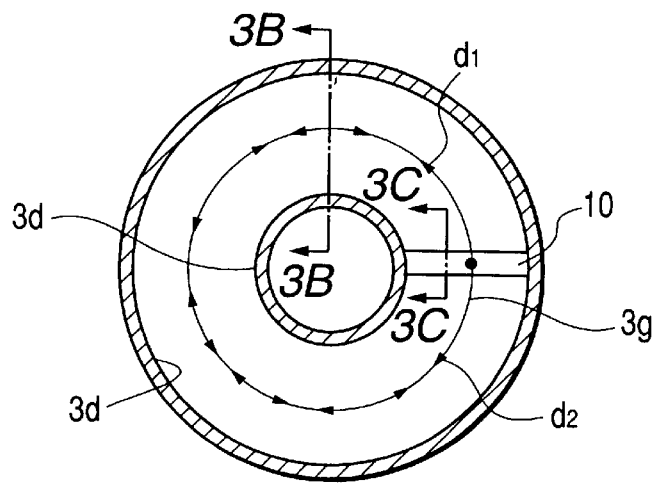
FIGS. 3A, 3B and 3C are schematic views showing the propagation and radiation of microwaves in a microwave applicator according to this invention.
Figure 3B:
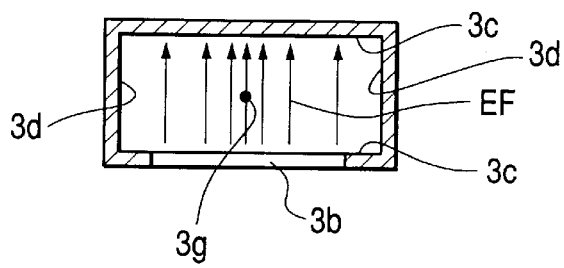
Figure 3C:
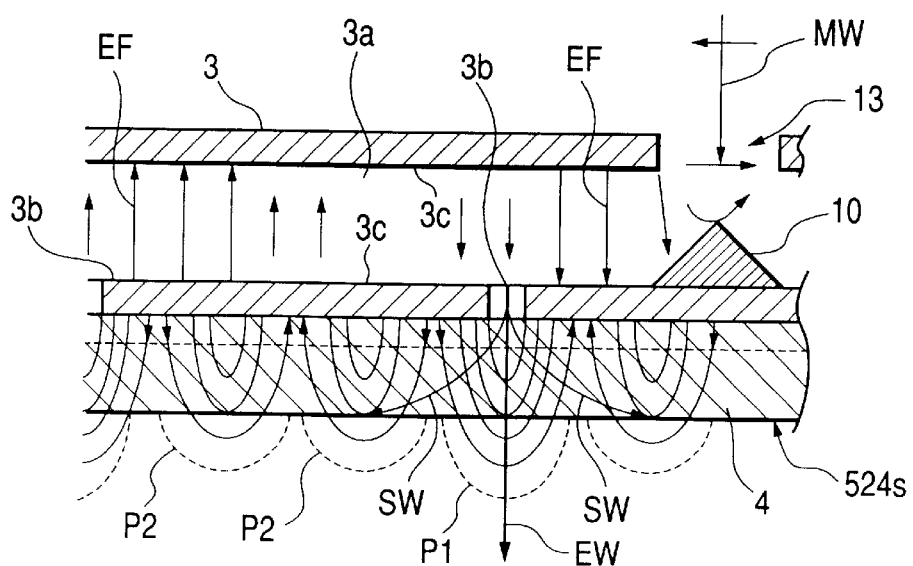

FIGS. 3A to 3C are schematic views describing the propagation of microwaves through the annular waveguide of the microwave applicator and the radiation of microwaves through the slots.

FIG. 3A shows the annular waveguide as seen from above, FIG. 3B shows a cross section taken along line 3B—3B, and FIG. 3C shows a cross section taken along line 3C—3C.

The microwaves introduced through the microwave introducing port 13 have their course changed so as to fork clockwise $d_2$ and counterclockwise $d_1$. Each slot is provided so as to cross the microwave traveling directions $d_1$ and $d_2$ so that the microwaves travel while being emitted through the slots.

Since the annular waveguide has no terminals and is endless, the microwaves, which propagate in the directions $d_1$ and $d_2$, interfere mutually to generate standing waves of a predetermined mode. Reference numeral 3g denotes an annulus (ring) formed by connecting width-wise centers of the waveguide, and the standing waves can be generated more easily by setting the length of this ring, that is, the circumferential length at an integral multiple of the guide wavelength (wavelength in waveguide).

FIG. 3B shows a surface perpendicular to the microwave traveling direction. In this figure, the upper and bottom surfaces 3c of the waveguide form H-planes perpendicular to the direction of electric field EF, while the right and left surfaces 3d of the waveguide form E planes parallel to the direction of the electric field EF. Thus, the cross section of the waveguide that is perpendicular to the microwave traveling direction is rectangular.

Microwaves MW introduced into the annular waveguide 3a through the microwave introducing port 13 are distributed by the distributor 10 to the right and left of the drawing and propagate at a guide wavelength longer than the wavelength in the free space. Reference symbol EF indicates electric-field vectors perpendicular to both the microwave traveling directions and the H-planes of the waveguide 3a. For example, leakage waves EW radiated through the dielectric window 4 from the slots 3b provided at an interval equal to ½ or ¼ of the guide wavelength generate a plasma P1 near the slots 3b. In addition, microwaves, which are incident at the angle of polarization or more relative to a straight line perpendicular to an inner surface 524S of the dielectric window 4, are entirely reflected from the inner surface 524S and propagate over the inner surface 524S of the dielectic window as surface waves SW. The surface waves SW filter through the dielectric window as an electric field to also generate plasma P2.

Thus, the gas is excited by the high density plasma as generated to process the surface of the article to be processed W.

Since the use of such a plasma processing apparatus can generate a high density, low potential plasma of a uniformity within ±3%, an electron density $10^{12}/cm^3$ or more, an electron temperature 3 eV or less, and a plasma potential 20V or less in a large diameter space of a diameter of 300 mm or more at a microwave power of –1 kW or more, the gas can fully be reacted and supplied in an active state to the article to be processed. Furthermore, when the pressure is 2.7 Pa and the microwave power is 2 kW, any current due to the microwaves cannot be detected at a location apart by 8 to 10 mm away from the inner surface of the dielectric window. This indicates the formation of a very thin plasma layer. Thus, the surface damage due to incident ions of the article to be processed can be reduced, thereby enabling high quality and high speed processing even at low temperatures.

Figure 4A:
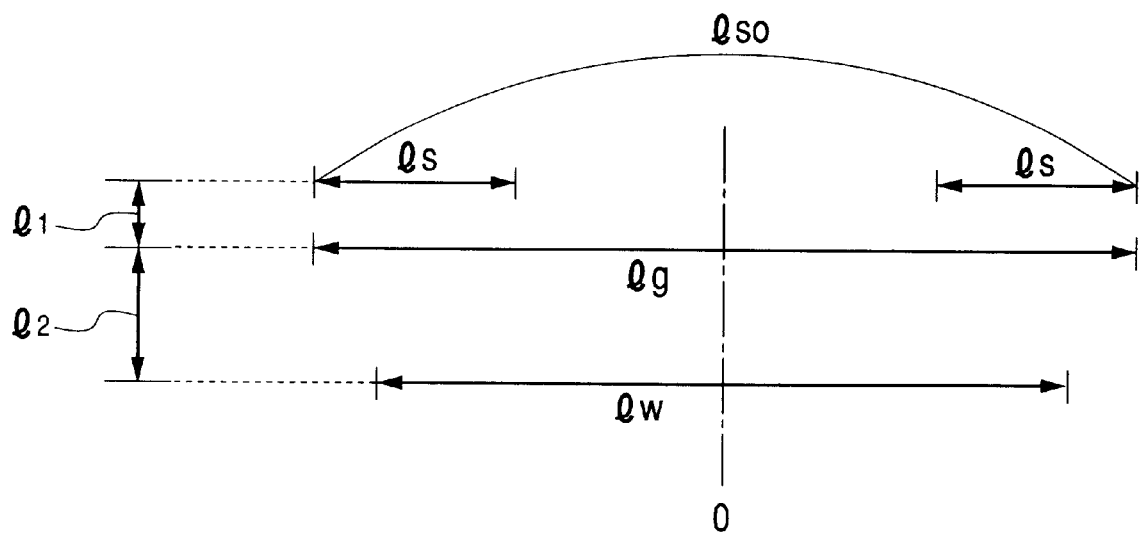
FIGS. 4A and 4B are schematic views showing the locations of slots, gas emission ports, and an article to be processed in the plasma processing apparatus according to this invention.
Figure 4B:
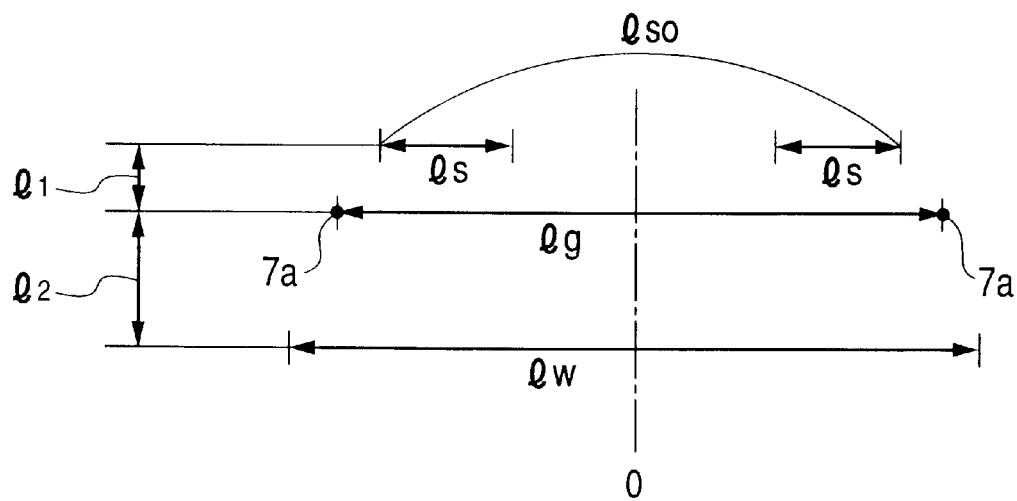

FIGS. 4A and 4B show the positions of the slots and gas emission ports of the microwave applicator and the position of the article to be processed.

Reference symbol lw indicates the distance from one end of the article to be processed W to the other end thereof (the interval in the direction parallel with the H-plane), and corresponds to the aperture of a disc-shaped article to be processed such as an Si wafer. For an 8-inch wafer, lw is about 200 mm. For a square article to be processed such as a glass substrate, lw corresponds to its side length, that is, its vertical or horizontal length.

In FIG. 4A, lg is the distance from one of the gas emission ports to the other opposed to it (the interval in the direction parallel to the H-plane), and is longer than the distance lw.

Reference symbol ls indicates the length of a single slot, and lso indicates the distance from the external end of one of the slots to the external end of the other of the slots existing at a position opposed to the above one slot (the interval in the direction parallel to the H-plane), and meets the relationship lso≈lg.

Further, in the embodiments of this invention, it is more preferable to meet the relationship $l_1 < l_2$ in the direction perpendicular to the H-plane having the slots provided.

Here, $l_1$ indicates the distance from the bottom (inner) surface of the dielectric window immediately below the slots to the gas emission ports 7a (the interval in the normal direction).

Reference symbol $l_2$ indicates the distance from the gas emission ports 7a to the to-be-processed surface of the article to be processed W (the interval in the normal direction).

Thus, by setting the positions of the gas emission ports closer to the dielectric window 4 than to the article to be processed W in this manner, the gas excitation or decomposition efficiency can be further improved.

As with FIG. 4A, FIG. 4B shows the positions of the slots and gas emission ports of the microwave applicator and the position of the article to be processed, that is, shows a variation of the example of FIG. 4A.

Reference symbol lw indicates the distance from one end of the article to be processed W to the other end thereof, and corresponds to the aperture in case of a disc-like article to be processed such as an Si wafer. For a 12-inch wafer, lw is about 300 mm. For a square article to be processed such as a glass substrate, lw corresponds to its side length, that is, its vertical or horizontal length.

Reference Symbol lg is the distance from one of the gas emission ports to the other opposed to it, and is shorter than the distance lw.

These settings allow the emitted gas to easily flow to reach the vicinity of the center O via an area located immediately below the slots and having a high plasma density.

Reference symbol ls indicates the length of a single slot, and lso indicates the distance from the external end of one of the slots to the external end of the other one of the slots existing opposed to the above one slot, and meets the relationship lso<lg.

In the embodiments of this invention, it is more preferable to meet the relationship $l_1 < l_2$ in the direction perpendicular to the H-plane in which the slots are provided.

Here, $l_1$ indicates the distance from the bottom (inner) surface of the dielectric window immediately below the slots to the gas emission ports 7a.

Reference symbol $l_2$ indicates the distance from the gas emission ports 7a to the to-be-processed surface of the article to be processed W.

By setting the positions of the gas emission ports closer to the dielectric window 4 than to the article to be processed W in this manner, the gas excitation or decomposition efficiency can be further improved.

In particular, apparatuses that meet the relationship in FIG. 4B are more suitable for the processing of large-area articles to be processed such as wafers of 300 mm or more diameter or substrates equivalent thereto than those which meet the relationship in FIG. 4A.

(Microwave Supply Means)

The microwave supply means preferably used for this invention is an annular waveguide (annular hollow waveguide) having a rectangular cross section and a plurality of slots in the H-plane, as shown in FIGS. 1, 2 and 3A to 3C. More preferably, it is desired to be endless.

Figure 5A:
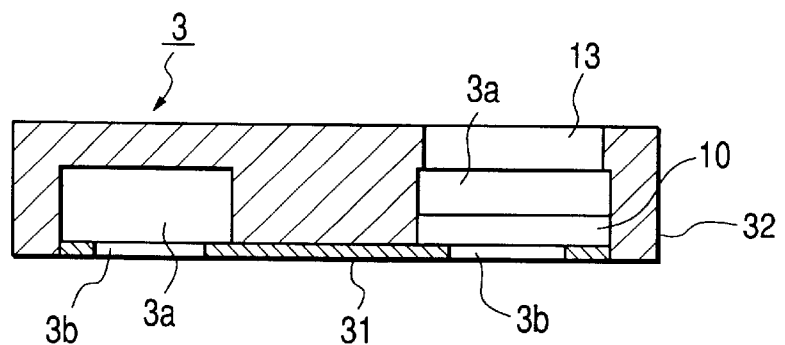
FIGS. 5A, 5B and 5C are schematic views showing a microwave applicator according to another embodiment of this invention.
Figure 5B:
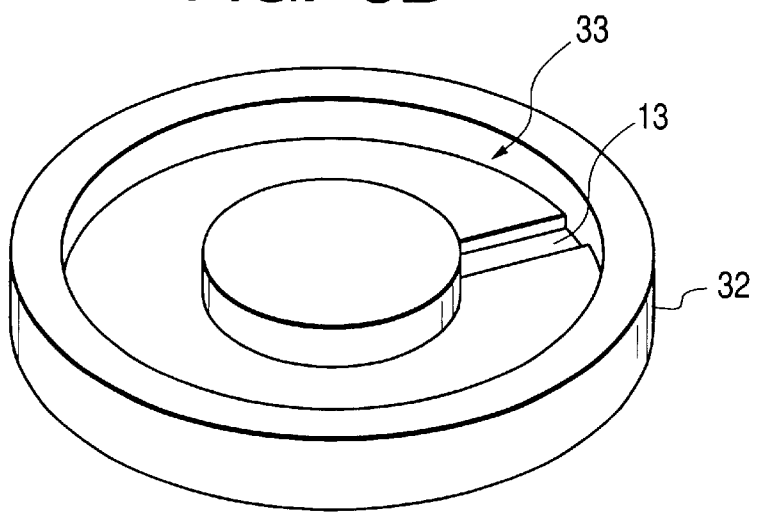
Figure 5C:
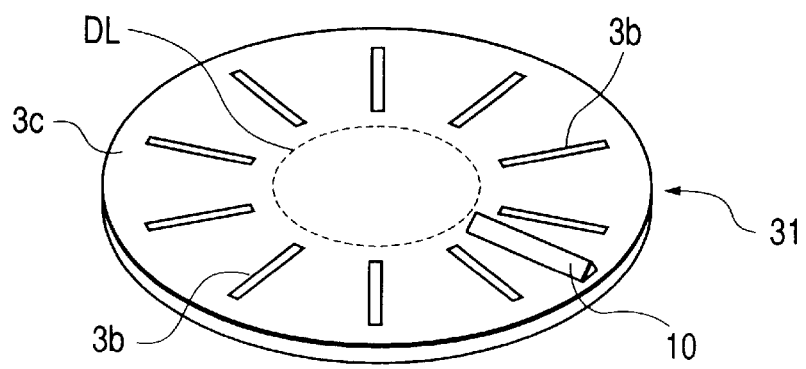

Although the example of FIG. 1 is shaped like a ring by bending a rectangular waveguide to be annular, the microwave supply means used in this invention may have a disc-like outline as shown in FIGS. 5A to 5C.

FIGS. 5A to 5C show a microwave applicator according to another embodiment of this invention.

The microwave applicator of FIGS. 5A to 5C is an assembly (or builtup member) of a first conductive member 32 in which an endless annular recessed portion 33 and an opening forming the microwave introducing port 13 are formed, and a second conductive member 31 which is shaped like a relatively thin disc and in which a plurality of slots 3b are formed.

FIG. 5A shows a cross section, FIG. 5B shows the first conductive member 32, and FIG. 5C shows the second conductive member 31.

By configuring the H-plane having the slots 3b therein to be detachable, the following effects can be obtained.

By producing beforehand a plurality of types of second conductive members 31 having different slot shapes, sizes, numbers, distributions, and so on, the second conductive member 31 can be replaced by an appropriate one depending on the required microwave radiant intensity or plasma processing. This serves to increase the degree of freedom of design of the microwave applicator and enables it to be produced with low costs.

Of course, the disc-like second conductive member 31 can be shaped like a donut by cutting its center out along a broken line DL.

The second conductive member 31 is assembled in such a way as to be sandwiched by the first conductive member 32 and the dielectric window described above.

Figure 6A:
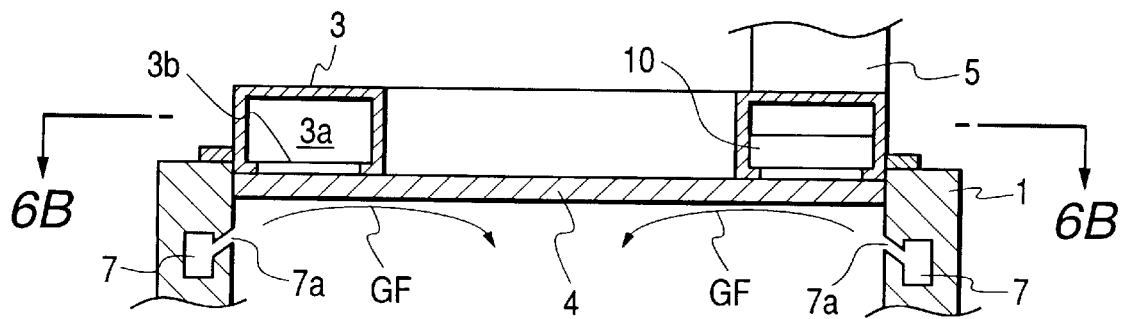
FIGS. 6A and 6B are schematic views showing another microwave applicator used in this invention.
Figure 6B:
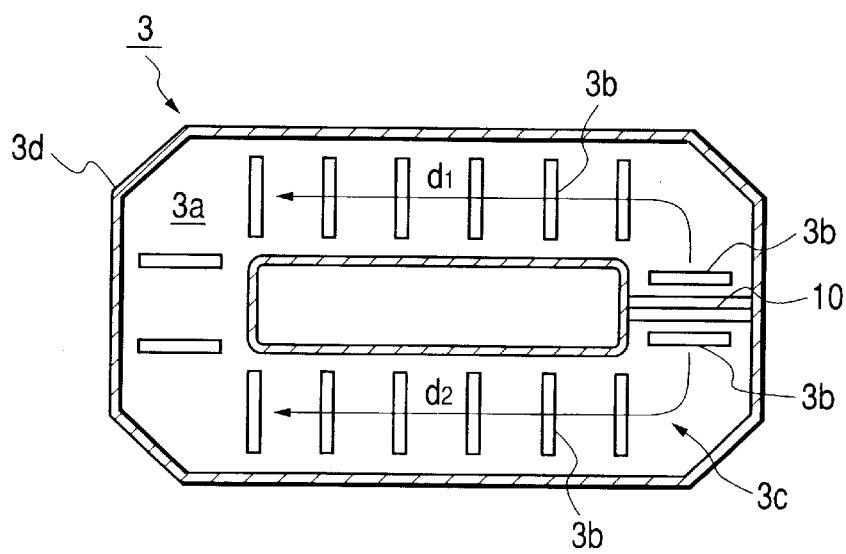

FIGS. 6A and 6B show another microwave supply means used in this invention. FIG. 6A shows a longitudinal sectional view and FIG. 6B shows a horizontal sectional view taken along line 6B—6B in FIG. 6A.

The microwave applicator 3 has a rectangular annular (or circular) waveguide 3a with chamfered corners as shown in FIG. 6B, and is preferred for works such as glass substrates for flat panel displays or image sensors, rectangular substrates, or web substrates for solar cells.

In this microwave applicator 3, microwaves introduced through a rectangular waveguide 5 have their course changed by the distributor 10 so as to travel clockwise $d_2$ and counterclockwise $d_1$ while being emitted through slots 3b provided in an H-plane 3c.

While traveling in the respective directions $d_1$ and $d_2$, the microwaves interfere with each other and attenuate. Once the propagation of the microwaves through the waveguide 3a has stabilized, standing waves are generated in the waveguide 3a.

The microwaves radiated through the slots 3b are transmitted through a dielectric window 4 to be supplied to the plasma generation space in a container 1 based on the principle described above with reference to FIGS. 3A to 3C.

In the container 1, a gas is emitted through gas emission ports 7a provided obliquely, which is excited immediately below the dielectric window 4 and then flows as shown by arrows GF in the drawing.

As the material of the member constituting the annular waveguide used for the microwave plasma processing apparatus according to this invention described above, any conductor may be used, but an optimal material is stainless steel plated with Al, Cu, or Ag/Cu that has a high conductivity in order to minimize the propagation loss of microwaves. The introducing port for the annular waveguide used in this invention may be of the type that is provided in the H-plane so that microwaves are introduced perpendicularly to the H-plane and distributed at the introducing section to the right and left directions relative to the microwave propagation space as long as it can efficiently introduce microwaves into the microwave propagation space in the annular waveguide. However, microwaves can be introduced in a tangential direction relative to the propagation space which is parallel to the H-plane.

The shapes of the slots used in this invention may be any one of a rectangle, an ellipse, an S-shape, a cross, an array, or the like as long as the lengths of the slots in the direction perpendicular to the microwave propagation direction is ¼ or more of the wavelength in the waveguide (the guide wavelength). Although an optimal slot interval in this invention is not particularly limited, it is desirable to arrange the slots at an interval of at least ½ of the guide wavelength so that the electric fields crossing the slots intensify each other by interference. Especially, ½ of the guide wavelength is optimal. The slot is preferably a long opening, for example, one which is 1 to 10 mm wide and 40 to 50 mm long. It is also preferable to arrange the slots radially with regard to the center of the ring.

A specific example is described with reference to the drawings.

Figure 7A:
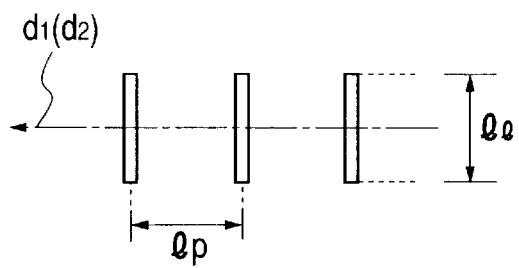
FIGS. 7A, 7B and 7C are plan views showing configurations of slots used in this invention.
Figure 7B:
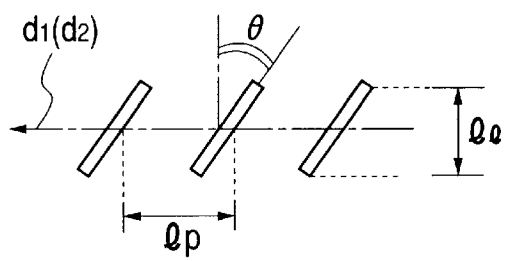
Figure 7C:
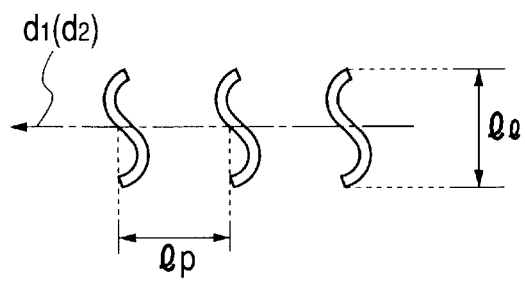

FIGS. 7A to 7C show the shapes of various slots used for the microwave supply means according to this invention.

FIG. 7A shows slots of length $l_1$ the longitudinal direction of which intersects the microwave traveling direction $d_1$ ($d_2$) and which are mutually separated at a pitch $l_p$.

FIG. 7B shows slots that intersect the microwave traveling direction $d_1$ ($d_2$) at a tilt angle $\theta$, that have a component $l_1$ perpendicular to the traveling direction $d_1$ ($d_2$), and that are mutually separated at a pitch $l_p$.

FIG. 7C shows S-shaped slots.

The slot arrangement interval, that is, pitch $l_p$ is preferably ½ or ¼ of the wavelength in the waveguide (the guide wavelength), as described above.

The length of the slot $l_l$ in the direction perpendicular to the microwave traveling direction is preferably within the range of ¼ to ⅜ of the guide wavelength.

Figure 8:
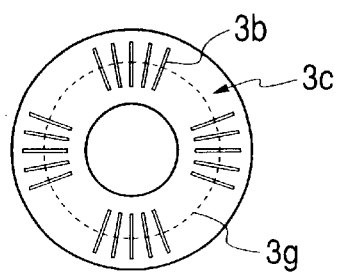
FIG. 8 is a schematic view showing an example of arrangement of another type of slots used in this invention.

In addition, all slots need not be disposed at an equal interval, for example, a pitch of ½ or ¼ of the guide wavelength, but groups of slots disposed at an equal pitch may be provided at an interval longer than ½ of the guide wavelength, as shown in FIG. 8.

The broken line 3g in the figure is an annulus (ring) formed by connecting the width-wise centers of the annular waveguide together, and it is preferable that the circumferential length of this ring is an integral multiple of the guide wavelength.

In addition, in order to improve the uniformity of the microwave radiant intensity, it is preferable that the supplied microwaves have such a power as to allow the microwaves to propagate through the annular waveguide one or more rounds, more preferably, two or more rounds. In this case, the distributor 10 may be omitted.

(Dielectric Window)

The shape and material of the dielectric window used in this invention are those which can transmit microwaves of 0.8 to 20 GHz but do not transmit any gas.

The shape of the dielectric window may be disc-like or donut-like one that singly covers the whole of the underside of the H-plane as shown in FIG. 1, otherwise the dielectric window may be provided in plurality corresponding to the respective slots so as to close only the slot portions. However, in order to facilitate the assembly of the vacuum container and to increase the degree of freedom of the design of the slots, the dielectric window is more preferably configured as a plate-like member common to the respective slots.

As the dielectrics used in the present microwave plasma processing apparatus and method, there can be included silicon oxide based quartz (silica), various glasses, and inorganic substances such as $Si_3N_4$, NaCl, KCl, LiF, $CaF_2$, $BaF_2$, $Al_2O_3$, AlN, and MgO, but films or sheets of organic substances such as polyethylene, polyester, polycarbonate, cellulose acetate, polypropylene, polyvinyl chloride, polyvinylidene chloride, polystyrene, polyamide, and polyimide are also applicable. Particularly, plate-like dielectrics comprised of quartz, alumina or the like are preferably used.

(Container)

As the container (vessel) used in the present invention, containers the inner pressure of which can be evacuated to a pressure below the atmospheric pressure, in order to substitute the gas therein or to generate a plasma therein.

The member constituting the container is made of a conductor such as aluminium, stainless steel, etc., an insulator such as quartz, silicon carbide, etc., or a combination of a conductive member and an insulating member.

If the insulator is used, it may be integrated with the dielectric window to constitute the container.

In addition, the inner surface of a conductive container may be covered with an insulating film.

The container is configured so that the internal pressure thereof can be reduced down to at least 0.1 mTorr (about $1.33 \times 10^{-2}$ Pa).

(Gas Supply Means)

As the gas supply means used in this invention, those which are provided with emission ports through which a gas is emitted toward the H-plane of the microwave supply means. It is desirable that a gas emission path communicating with the gas emission port be formed perpendicularly or obliquely to the H-plane.

Figure 9A:
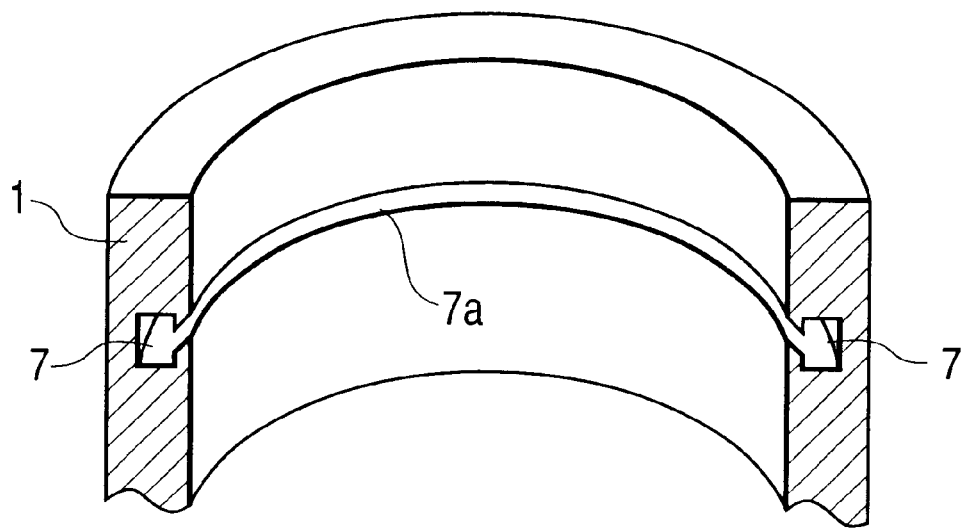
FIGS. 9A and 9B are schematic views showing configurations of gas supply means used in this invention.

The gas emission port may be either a plurality of openings provided apart from one another along the annular waveguide as shown in FIG. 1 or a slit provided along the annular waveguide as shown in FIG. 9A.

Figure 9B:
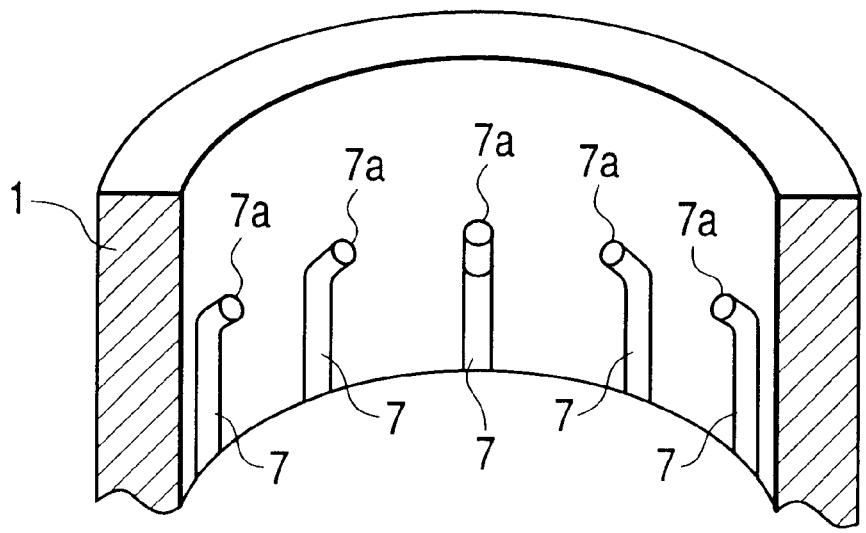

Alternatively, as shown in FIG. 9B, the gas supply means may be a plurality of gas supply pipes each having a gas emission port.

It is more preferred that the positions of the gas emission ports in the direction parallel to the H-plane be set as shown in FIGS. 4A and 4B, which facilitates uniform processing in a large area.

The gas supply means is connected to a gas bomb or a vaporizer via a mass flow controller, valves, joints, or the like (not shown).

The holding means for holding an article to be processed may have a planar holding surface or may hold the article at several points using pins or the like. The holding surface or points may be composed of various materials such as a conductor, an insulator and so on.

The holding means may further be provided with a heating or cooling means.

A configuration having liftable lift pins to facilitate carrying in and carrying out of the article to be processed is also preferable as the holding means.

In addition, it is also preferable to provide a bias application means in the holding means in order to control the movement and positions of particles in plasma, whereby a DC or AC bias can be applied to the article to be processed.

In the present microwave plasma processing apparatus and method, a magnetic field generating means may be used for processing at a lower pressure. As the magnetic field used in the present plasma processing apparatus and method, although the mirror magnetic field is applicable, the magnetron magnetic field is optimal which generates a loop magnetic field on a curve connecting the centers of the plurality of slots of the annular waveguide together and has a larger magnetic flux density in a magnetic field in the vicinity of the slots than in a magnetic field in the vicinity of the article to be processed. As the magnetic field generating means, permanent magnets as well as coils may be used. When a coil is used, another cooling means such as a water- or air-cooling mechanism may be used to prevent overheating.

In addition, in order to further improve the quality of the processing, the surface of the article to be processed may be irradiated with ultraviolet light. As the light source, those which can radiate a light that is absorbed by the article to be processed or the gas adhering thereto, and it is appropriate to use excimer lasers and lamps that use a dimer such as ArF, KrF, XeCl, etc., rare gas resonance line lamps, low-pressure mercury lamps, and the like.

In this invention, it is preferable to use a plasma generator such as magnetron to generate microwaves of a frequency selected from the range of 0.8 GHz to 20 GHz, and a tuner, an isolator, a mode converter, and so on may be provided to the plasma generator to propagate and supply microwaves of a predetermined mode to the microwave applicator.

As the microwaves introduced into the introducing port of the microwave applicator, microwaves of TE mode are preferably used, and particularly microwaves of TEno or Hon mode (n is a natural number) are more preferably introduced.

Thus, in the annular waveguide, electric field vectors of the microwaves are perpendicular to the plane with the slots, which forms the H-plane.

In the annular waveguide $3a$, the microwaves propagate in $TE_{10}$ ($H_{01}$) mode. However, since there is a case where standing waves may be finally generated, the propagation mode of the microwaves in the waveguide $3a$ in this case can also be considered to be a different mode.

Next, the present processing method is described.

Figure 10:
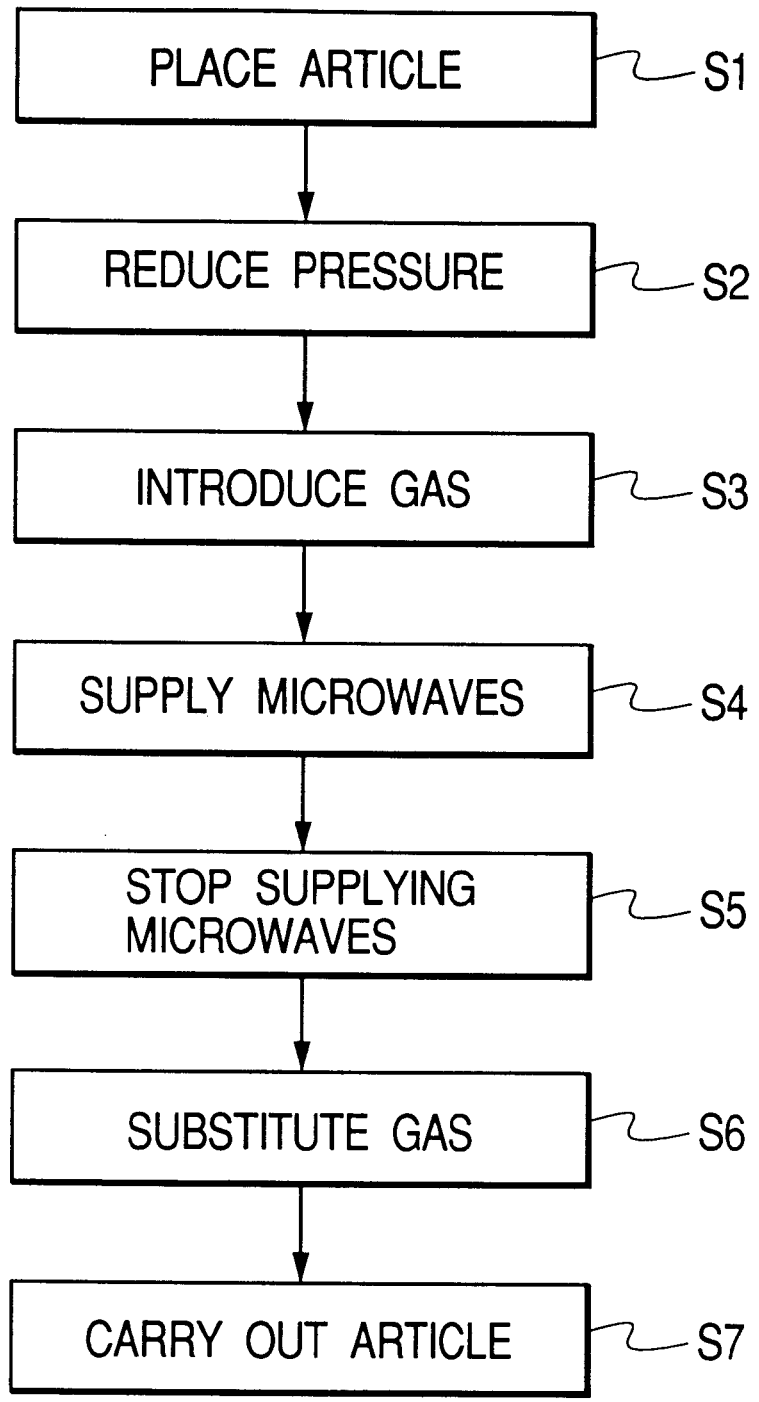
FIG. 10 is a view showing a flowchart of a plasma processing method according to this invention.

First, the container 1 is opened, an article to be processed is placed on the holding means 2, and the container 1 is closed (step S1 in FIG. 10).

Then, the internal pressure of the container 1 is reduced from the atmospheric pressure down to about 1.3 Pa or less using a vacuum pump (not shown) (step 2 in FIG. 10).

Next, the gas is emitted to the inside of the container 1 through the gas emission ports $7a$ of the gas supply means 7 (step S3 in FIG. 10).

After the pressure in the container 1 has stabilized, a microwave oscillator (not shown) is turned on to generate microwaves, which are supplied to the inside of the container 1 using the microwave introducing means 3 according to this invention (step S4 in FIG. 10).

Plasma emission is observed through a monitoring window provided as required in the container 1.

After the predetermined processing time has elapsed, the supply of the microwaves is stopped (step S5 in FIG. 10).

The gas in the container 1 is substituted by nitrogen, Ar, He, Ne, or clean air for purging to return the internal pressure thereof to the atmospheric pressure (step S6 in FIG. 10).

Then, the container 1 is opened, and the article to be processed is carried out (step S7 in FIG. 10).

The above mentioned processing may be carried out repeatedly per one article to be processed.

The internal pressure of the plasma processing chamber according to the present microwave plasma processing method can be selected within a range of from 0.1 mTorr (about 0.133 Pa) to 10 Torr (about 1,330 Pa); more preferably, from 1 mTorr (about 0.133 Pa) to 100 mTorr (about 13.3 Pa) for CVD, plasma polymerization, or surface modification; from 0.5 mTorr (about 0.067 Pa) to 50 mTorr (about 6.67 Pa) for etching; and from 100 mTorr (about 13.3 Pa) to 10 Torr (about 1,330 Pa) for ashing. Further, in the case of cleaning, a range from 0.067 Pa to 13.3 Pa is preferred.

In formation of a deposited film according to the present microwave plasma processing method, suitable selection of the gases used enables efficient formation of various deposited films such as an insulating film of $Si_3N_4$, $SiO_2$, $Ta_2O_5$, $TiO_2$, TiN, $Al_2O_3$, AlN, $MgF_2$, $AlF_3$, etc.; a semiconductor film of a-Si (amorphous silicon), poly-Si (polysilicon), SiC, GaAs, etc.; and a metallic film of Al, W, Mo, Ti, Ta, etc.; and TiN, TiW, TiSiN, or the like.

An article 112 to be processed by the present plasma processing method may be semiconducting, conductive or insulating. Further, the surface thereof itself may be a semiconductor, an insulator, a conductor, or a composite thereof.

As the conductive article to be processed, there can be included metals such as Fe, Ni, Cr, Al, Mo, Au, Nb, Ta, V, Ti, Pt, Pb, etc., and alloys thereof such as brass, stainless steel, etc.

As the insulating article to be processed, there can be included $SiO_2$-based quartz; various glasses; inorganic substances such as $Si_3N_4$, NaCl, KCl, LiF, $CaF_2$, $BaF_2$, $Al_2O_3$, AlN, MgO, etc.; and films or sheets of organic substances such as polyethylene, polyester, polycarbonate, cellulose acetate, polypropylene, polyvinyl chloride, polyvinylidene chloride, polystyrene, polyamide, polyimide, etc.

As the gases used in the case of forming a thin film on an article to be processed by the CVD process, specifically when a thin film of an Si-based semiconductor such as a-Si, poly-Si, or SiC, there can be included those which are in a gaseous state at ordinary temperature and pressure or which are gassified easily, for example, inorganic silanes such as $SiH_4$ or $Si_2H_6$; organic silanes such as tetraethylsilane (TES), tetramethylsilane (TMS), dimethylsilane (DMS), dimethyldifluorosilane (DMDFS), or dimethyldichlorosilane (DMDCS); or halosilanes such as $SiF_4$, $Si_2F_6$, $Si_3F_8$, $SiHF_3$, $SiH_2F_2$, $SiCl_4$, $Si_2Cl_6$, $SiHCl_3$, $SiH_2Cl_2$, $SiH_3Cl$, or $SiCl_2F_2$. In addition, as an additional gas or a carrier gas that may be mixed with the Si material gas and introduced, there may be included $H_2$, He, Ne, Ar, Kr, Xe, and Rn.

As the material containing Si atoms used for formation of a thin film based on an Si compound such as $Si_3N_4$ or $SiO_2$, the following materials that maintain a gaseous state at ordinary temperature and pressure or that are gassified easily using a vaporizer or a bubbler can be used: inorganic silanes such as $SiH_4$ or $Si_2H_6$; organic silanes such as tetraetoxysilane (TEOS), tetramethoxysilane (TMOS), octamethylcyclotetrasilane (OMCTS), dimethyldifluorosilane (DMDFS), or dimethyldichlorosilane (DMDCS); or halosilanes such as $SiF_4$, $Si_2F_6$, $Si_3F_8$, $SiHF_3$, $SiH_2F_2$, $SiCl_4$, $Si_2Cl_6$, $SiHCl_3$, $SiH_2Cl_2$, $SiH_3Cl$, or $SiCl_2F_2$. In addition, as a nitrogen or an oxygen material gas that may be simultaneously introduced, there can be included $N_2$, $NH_3$, $N_2H_4$, hexamethyldisilazane (HMDS), $O_2$, $O_3$, $H_2O$, NO, $N_2O$, $NO_2$, and so on.

The material containing metal atoms which is used to form a thin metal film such as of Al, W, Mo, Ti, Ta, or TiW includes organic metals such as trimethyl aluminium (TMAl), triethyl aluminium (TEAl), triisobutyl aluminium (TIBAl), dimethyl aluminium hydride (DMAlH), tungsten carbonyl ($W(CO)_6$), molybdenum carbonyl ($Mo(CO)_6$), trimethyl gallium (TMGa), and triethyl gallium (TEGa); and halogenated metals such as $AlCl_3$, $WF_6$, $TiCl_3$, and $TaCl_5$. In this case, an additional or carrier gas may be mixed with the above Si material gas. As the additional or carrier gas, $H_2$, He, Ne, Ar, Kr, Xe, Rn, and so on may be included.

The material containing metal atoms which is used to form a thin metal compound film such as of $Al_2O_3$, AlN, $Ta_2O_5$, $TiO_2$, TiN, $WO_3$, TiW, or TiSiN includes organic metals such as trimethyl aluminium (TMAl), triethyl aluminium (TEAl), triisobutyl aluminium (TIBAl), dimethyl aluminium hydride (DMAlH), tungsten carbonyl ($W(CO)_6$), molybdenum carbonyl ($MO(CO)_6$), trimethyl gallium (TMGa), and triethyl gallium (TEGa); and halogenated metals such as $AlCl_3$, $WF_6$, $TiCl_3$, and $TaCl_5$. In this case, as an oxygen or a nitrogen material gas that may be simultaneously introduced includes $O_2$, $O_3$, $H_2O$, NO, $N_2O$, $NO_2$, $N_2$, $NH_3$, $N_2H_4$, and hexamethyldisilazane (HMDS).

As the etching gas introduced through the processing gas introducing port 115 to etch the surface of an article to be processed, there may be included $F_2$, $CF_4$, $CH_2F_2$, $C_2F_6$, $CF_2Cl_2$, $SF_6$, $NF_3$, $Cl_2$, $CCl_4$, $CH_2Cl_2$, $C_2Cl_6$, or the like.

As the ashing gas introduced through the processing gas introducing port 115 to remove organic components from the surface of an article to be processed such as a photoresist by means of ashing, there may be included $O_2$, $O_3$, $H_2O$, NO, $N_2O$, $NO_2$, and so on.

Further, in the case of the cleaning, the etching or ashing gas listed above, or hydrogen gas or an inactive gas may be used.

In addition, when the present microwave plasma processing apparatus and method is applied to surface modification, appropriate selection of the gas used enables the oxidation or nitridation treatment of an article to be processed or a surface layer consisting of, e. g., Si, Al, Ti, Zn, or Ta or the doping treatment with B, As, or P. Furthermore, the film formation technique used in this invention can be applied to the cleaning process, as described above. In this case, it can be used to cleaning of oxides, organic substances, or heavy metals.

As the oxidizing gas used for oxidation surface treatment of an article to be processed, there may be included $O_2$, $O_3$, $H_2O$, NO, $N_2O$, $NO_2$, or the like. In addition, the nitriding gas used to nitride the surface of the work includes $N_2$, $NH_3$, $N_2H_4$, and hexamethyldisilazane (HMDS).

In particular, as a cleaning/ashing gas that is introduced through a gas introducing port 105 when an organic substance on the surface of an article to be processed is cleaned or when an organic component on the surface of an article to be processed, such as a photoresist is removed by ashing, $O_2$, $O_3$, $H_2O$, NO, $N_2O$, $NO_2$, or the like may be included. In addition, as a cleaning gas that is introduced through a gas introducing port 105 when an inorganic substance on the surface of an article to be processed is cleaned, $F_2$, $CF_4$, $CH_2F_2$, $C_2F_6$, $CF_2Cl_2$, $SF_6$, $NF_3$, or the like may be included.

In addition, the microwave power supplied from the microwave power source preferably has a sufficient value to allow the microwaves to propagate through the annular waveguide one or more rounds, more preferably two or more rounds while being radiated through the slots, in order to improve the uniformity of the radiant intensity of the microwaves. In this case, it is desirable that no distributor be provided.

(Example of a Plasma Processing Apparatus)

Specific examples of the present microwave plasma processing apparatus are described below. This invention, however, is not limited to these examples.

(First Plasma Processing Apparatus)

A first specific example of the plasma processing apparatus according to this invention is as described above with reference to FIGS. 1 and 2.

(Second Plasma Processing Apparatus)

An example of the present microwave plasma processing apparatus which uses a two-way distributive, interfering, plate-like, slotted annular waveguide is described with reference to FIG. 11. Reference numeral 109 designates a plasma generation chamber in a container 101; 104 is a dielectric window that separates the plasma processing chamber 109 from the atmosphere; 103 is a microwave supply means for supplying microwaves to the inside of the plasma generation chamber 109; 105 is a rectangular waveguide for introducing microwaves into an annular waveguide 103b with a planar, slotted H-plane; 103a is a waveguide forming a microwave propagating space of a rectangular cross section for propagating microwaves in the microwave supply means 103; 103b is a slot through which microwaves are introduced; W is an article to be processed; 102 is a holding means; 114 is heater as a heating means; 107 is a gas supply means; and 108 is an exhaust port.

In this plasma processing apparatus, the gas supply system has at least a gas source 21 such as a gas bomb, vaporizer or bubbler, a valve 22, and a mass flow controller 23 that controls the amount of a gas supplied to the plasma generation chamber 109. Then, the gas is emitted through gas emission ports 107a inclined upward.

In addition, the gas exhaust system has at least an exhaust conductance control valve 26, an opening/closing valve 25, and a vacuum pump 24, and the exhaust conductance control valve 26 controls the pressure inside the plasma generation chamber 109 during processing.

Reference numeral 6 denotes a microwave power source, which has a microwave oscillator such as a magnetron further provided with adjustment means such as a tuner, an isolator, or a mode converter as required.

The generation of a plasma and the processing are carried out as follows. The article to be processed W is put on the article holding means 102 and is heated to a desired temperature using a heater 114. The inside of the plasma generation chamber 109 is evacuated via an exhaust system (not shown). Subsequently, a plasma processing gas is introduced at a predetermined flow rate into the plasma generation chamber 109 via the gas supply means 107. Then, a conductance valve (not shown) provided in the exhaust system (not shown) is adjusted to maintain the inside of the plasma generation chamber 109 at a predetermined pressure. A desired power from a microwave power source (not shown) is introduced into the annular waveguide 103 through the waveguiding pipe 105 in $TE_{10}$ mode. The introduced microwaves are divided into two by a distributor 110 and then propagate through the space 103a. The microwaves as divided into two interfere with each other to generate standing waves. The microwaves strengthen an electric field that cross the slots 103b at every period of ½ of the guide wavelength, and are then supplied to the plasma generation chamber 109 via the slots 103b through the dielectric window 104. The electric field of the microwaves supplied to the inside of the plasma generation chamber 109 accelerate electrons to generate a plasma P at, for example, the upper part of the plasma processing chamber 109. At this point, the processing gas is excited by the high density plasma as generated to process the surface of the article to be processed W put on the holding means 102.

The dielectric window 104 is formed of a plate-like synthetic quartz of a diameter 299 mm and a thickness 12 mm. The planar, slotted annular waveguide 103 has a 27 mm×96 mm inner wall cross section and a central diameter of 202 mm and can propagate microwaves of $TE_{10}$ mode. As the material of the planar, slotted annular waveguide 103, Al is used entirely in order to suppress the propagation loss of microwaves. In the H-plane of the planar, slotted annular waveguide 103, are formed slots to introduce microwaves into the plasma generation chamber 109. The shape of the is a rectangle of 42 mm in length and 3 mm in width and the slots are formed radially at an interval of ½ of the guide wavelength. Although the guide wavelength depends on the frequency of microwaves used and the size of the cross section of the waveguide, the use of microwaves of a frequency 2.45 GHz and a waveguide of the above mentioned size provides a guide wavelength of about 159 mm. In the planar, slotted annular waveguide 103 used above, eight (8) slots 103*b* are formed at an interval of about 79.5 mm. To the planar, slotted annular waveguide 103, are connected a 4E tuner, a directional coupler, an isolator, and a microwave power source (not shown) of frequency 2.45 GHz in this order so that microwaves of $TE_{10}$ mode are introduced.

Figure 11:
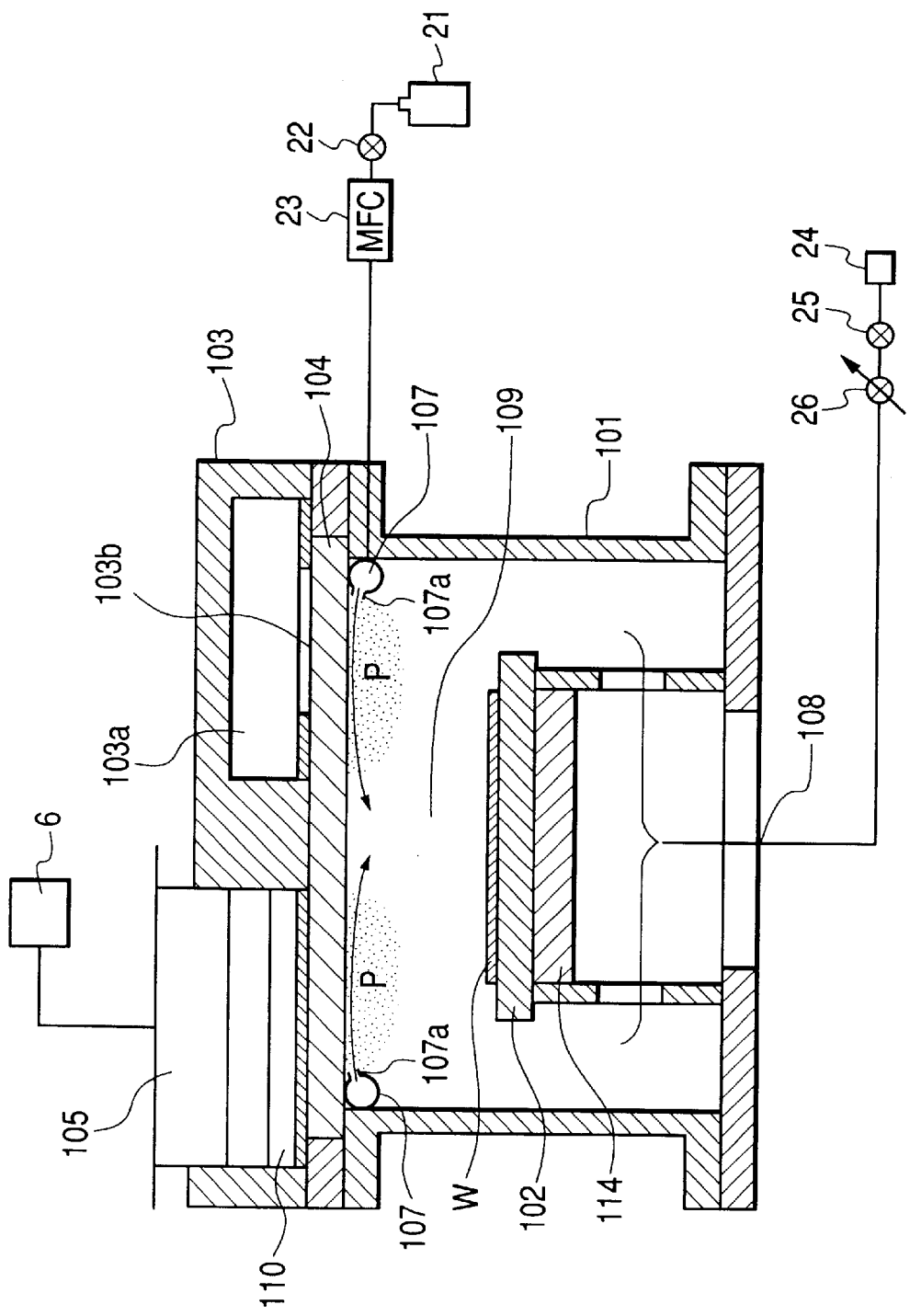
FIG. 11 is a schematic view showing another plasma processing apparatus according to this invention.

The microwave plasma processing apparatus shown in FIG. 11 was used to generate a plasma under the conditions of an Ar flow rate of 500 sccm, pressures of 10 mTorr and 1 Torr, and a microwave power of 1.5 kW, and the plasma obtained was measured. The plasma was measured as follows using a single probe method. The voltage applied to the probe was varied within a range of −50 V to +100 V, and a current flowing through the probe was measured by an I-V measuring apparatus. The electron density, the electron temperature and the plasma potential were calculated from the thus obtained I-V curve by the Langmuir method. As a result, the electron density was $1.3×10^{12}/cm^3$ ±2.1% (within a φ 200 surface) at 10 mTorr and $7.2×10^{11}/cm^3$ ±5.3% (within a φ 200 surface) at 1 Torr, and it was confirmed that a high density, uniform plasma was formed even in a high pressure region.

(Third Plasma Processing Apparatus)

An example of the present microwave plasma processing apparatus which uses a tangential introduction type, planar, slotted annular waveguide is described with reference to FIG. 12. Reference numeral 109 designates a plasma generation chamber; 104 is a dielectric window that separates the plasma processing chamber 109 from the atmosphere; 103 is a microwave supply means for supplying microwaves to the plasma generation chamber 109; 205 is an introducing section provided on the E-plane on the outer circumference of the planar slotted annular waveguide 103 for introducing microwaves; 103*a* is a microwave propagating space of a rectangular cross section for propagating microwaves in the planar slotted annular waveguide 103; 103*b* is slots provided in the H-plane of the planar slotted annular waveguide 103 to radiate microwaves; 102 is a means for holding the article to be processed W; 114 is heater to heat the article W; 107 is a processing-gas introducing means; and 108 is an exhaust port.

In this plasma processing apparatus, the gas supply system has at least a gas source 21 such as a gas bomb, vaporizer or bubbler, a valve 22, and a mass flow controller 23 that controls the amount of a gas supplied to the plasma generation chamber 109. The gas is emitted toward the dielectric window from gas emission ports 107*a* inclined upward.

In addition, the gas exhaust system has at least an exhaust conductance control valve 26, an opening/closing valve 25, and a vacuum pump 24, and the exhaust conductance control valve 26 controls the pressure inside the plasma generation chamber 109 during processing.

Reference numeral 6 denotes a microwave power source, which has a microwave oscillator such as a magnetron further provided with adjustment means such as a tuner, an isolator, or a mode converter as required.

The plasma processing is carried out as follows.

The article to be processed W is put on the article holding means 102 and is heated to a desired temperature using a heater 144. The inside of the plasma generation chamber 109 is evacuated via an exhaust system (not shown). Subsequently, a plasma processing gas is introduced at a predetermined flow rate into the plasma generation chamber 109 via the processing gas emission ports 107*a*. Then, a conductance valve (not shown) provided in the exhaust system (not shown) is adjusted to maintain the inside of the plasma generation chamber 109 at a predetermined pressure. A desired power from a microwave power source (not shown) is introduced into a planar slotted annular waveguide 203 through an introducing section 205. The introduced microwaves of $TE_{10}$ mode are supplied to the inside of the plasma generation chamber 109 through the dielectric window 104 via the slots 103*b* formed at an interval of ½ of the guide wavelength. Microwaves that have propagated through the waveguide 103 one round without being supplied to the chamber 109 interfere with microwaves newly introduced through the introducing section 105 to strengthen each other, and most of the microwaves are supplied to the inside of the plasma generation chamber 109 before they have propagated through the waveguide several rounds. The electric field of the supplied microwaves accelerate electrons to generate a plasma P in the upper part of the plasma generation chamber 109. At this point, the processing gas is excited by the high density plasma as generated to process the surface of the article to be processed W put on the holding means 102.

The dielectric window 104 is a plate of synthetic quartz of a diameter 299 mm and a thickness 16 mm. The planar slotted annular waveguide 103 is the same as described above and has a rectangular cross section of an inner-wall cross section size of 27×96 mm and a central diameter of 202 mm. As the material of the planar slotted annular waveguide 103, Al is used entirely in order to suppress the propagation loss of microwaves. In the H-plane of the planar slotted annular waveguide 103, are formed slots to introduce microwaves into the plasma generation chamber 109. The shape of the slots is a rectangle of 42 mm in length and 3 mm in width and the slots are formed radially at an interval of ½ of the guide wavelength. Although the guide wavelength depends on the frequency of microwaves used and the size of the cross section of the waveguide, the use of microwaves of a frequency 2.45 GHz and a waveguide of the above mentioned size provides a guide wavelength of about 159 mm. In the planar, slotted annular waveguide 103 used above, eight (8) slots are formed at an interval of about 79.5 mm. To the planar, slotted annular waveguide 103, are connected a 4E tuner, a directional coupler, an isolator, and a microwave power source (not shown) of frequency 2.45 GHz in this order.

Figure 12:
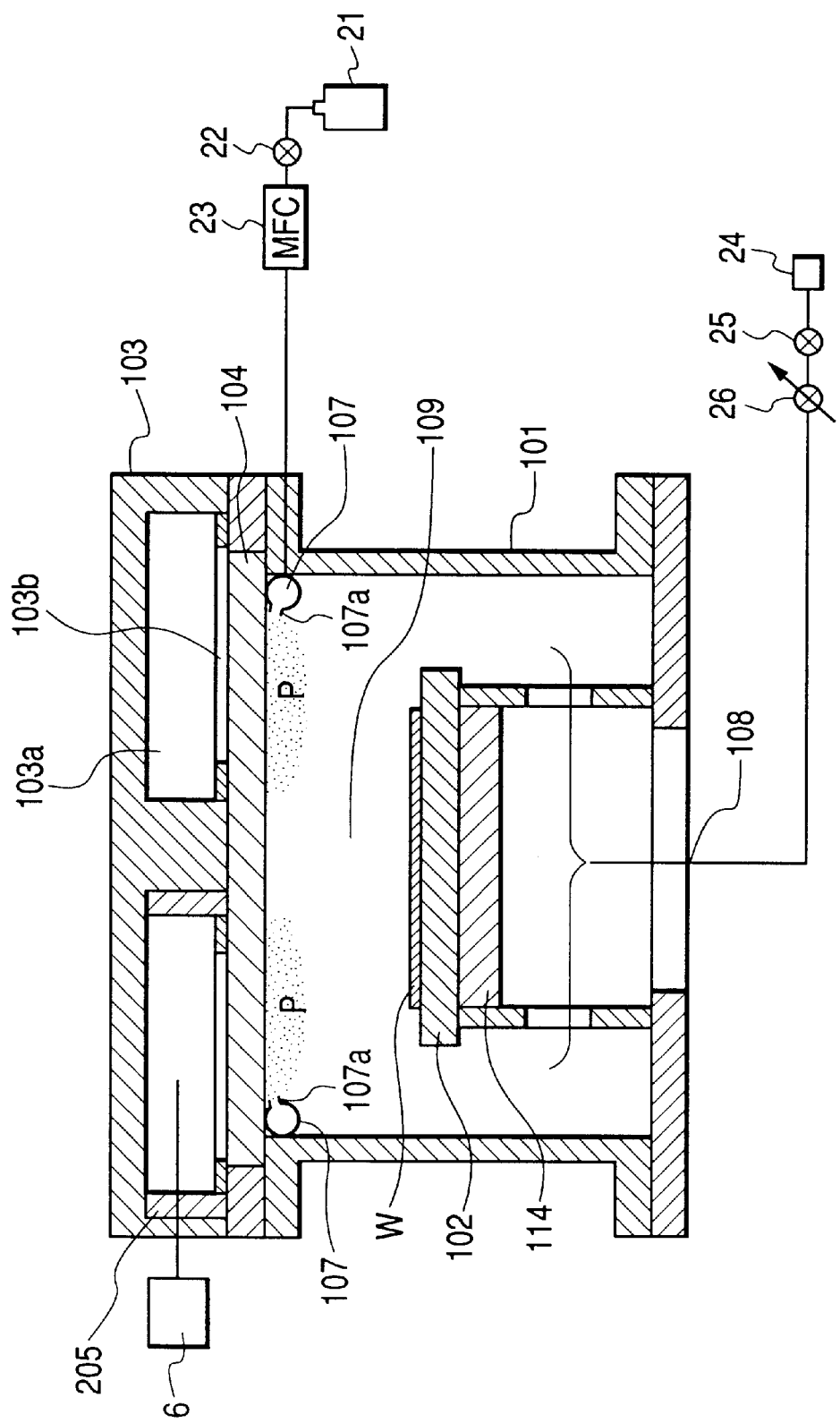
FIG. 12 is a schematic view showing still another plasma processing apparatus according to this invention.

The microwave plasma processing apparatus shown in FIG. 12 was used to generate a plasma under the conditions of an Ar flow rate of 500 sccm, pressures of 10 mTorr and 1 Torr, and a microwave power of 1.5 kW, and the plasma obtained was measured. The plasma was measured as follows using a single probe method. The voltage applied to the probe was varied within a range of −50 V to +100 V, and a current flowing through the probe was measured by an I-V measuring apparatus. The electron density, the electron temperature and the plasma potential were calculated from the thus obtained I-V curve by the Langmuir method. As a result, the electron density was $1.8×10^{12}/cm^3$ ±2.3% (within a φ 200 surface) at 10 mTorr and $7.7×10^{11}/cm^3$ ±5.6% (within a φ 200 surface) at 1 Torr, and it was confirmed that a high density, uniform plasma was formed even in a high pressure region.

(Fourth Plasma Processing Apparatus)

An example of the present microwave plasma processing apparatus which uses an RF bias application mechanism is described with reference to FIG. 13. Reference numeral 109 designates a plasma generation chamber; 104 is a dielectric window that separates the plasma processing chamber 109 from the atmosphere; 103 is a microwave supply means for supplying microwaves to the plasma generation chamber 109; 102 is a means for holding the article to be processed W; 114 is heater for heating the article to be processed; 107 is a gas supply means; 108 is an exhaust port; and 302 is an RF bias application means.

In this plasma processing apparatus, the gas supply system has at least a gas source 21 such as a gas bomb, vaporizer or bubbler, a valve 22, and a mass flow controller 23 that controls the amount of a gas supplied to the plasma generation chamber 109. The gas is obliquely emitted upward to the dielectric window 104 through gas emission ports 107a inclined upward.

In addition, the gas exhaust system has at least an exhaust conductance control valve 26, an opening/closing valve 25, and a vacuum pump 24, and the exhaust conductance control valve 26 controls the pressure inside the plasma generation chamber 109 during processing.

Reference numeral 6 denotes a microwave power source, which has a microwave oscillator such as a magnetron further provided with adjustment means such as a tuner, an isolator, or a mode converter as required.

The generation of a plasma and the processing are carried out as follows. The article to be processed W is put on the article holding means 102 and is heated to a desired temperature using the heater 114. The inside of the plasma generation chamber 109 is evacuated via an exhaust system (24 to 26). Subsequently, a plasma processing gas is introduced at a predetermined flow rate into the plasma generation chamber 109 using the gas supply means 107. Then, the conductance control valve 26 provided in the exhaust system (24 to 26) is adjusted to maintain the inside of the plasma generation chamber 109 at a predetermined pressure. The RF bias application means 302 is used to supply an RF power to the holding means 102, while a desired power from a microwave power source 6 is introduced into the plasma generation chamber 109 through the dielectric window 104 via slots 103b of the microwave supply means 103. The electric field of the microwaves supplied to the inside of the plasma generation chamber 109 accelerate electrons to generate plasma in the plasma generation chamber 109. At this time, the processing gas is excited by the high density plasma generated to process the surface of the article to be processed W put on the holding means 102. In addition, the RF bias can be used to control the kinetic energy of ions incident to the article to be processed.

(Fifth Plasma Processing Apparatus)

An example of the present microwave plasma processing apparatus which uses a cooling means is described with reference to FIG. 14. Reference numeral 109 designates a plasma generation chamber; 104 is a dielectric window that separates the plasma generation chamber 109 from the atmosphere; 203 is a microwave supply means for supplying microwaves to the plasma generation chamber 109, which consists of a planar, slotted, endless annular waveguide; 102 is a means for holding the article to be processed W; 414 is cooler for cooling the article to be processed; 107 is a gas supply means; 108 is an exhaust port; and 302 is an RF bias application means.

In this plasma processing apparatus, the gas supply system has at least a gas source 21 such as a gas bomb, vaporizer or bubbler, a valve 22, and a mass flow controller 23 that controls the amount of a gas supplied to the plasma generation chamber 109. The gas is emitted obliquely upward from gas emission ports 107a.

In addition, the gas exhaust system has at least an exhaust conductance control valve 26, an opening/closing valve 25, and a vacuum pump 24, and the exhaust conductance control valve 26 controls the pressure inside the plasma generation chamber 109 during processing.

Reference numeral 6 denotes a microwave power source, which has a microwave oscillator such as a magnetron further provided with adjustment means such as a tuner, an isolator, or a mode converter as required.

The cooling means 414 is provided with a heat pipe 417 having an introducing pipe 415 that introduce a refrigerant and a discharge pipe 416 that discharges the refrigerant.

The heat generated by the etching or sputtering phenomenon of the article to be processed W is emitted outside by the heat pipe 417.

Although, in this plasma processing apparatus, the length of the slots of the microwave supply means 203 made equal to the width (h) of the H-plane of the waveguide 203a, the length of the slots 203b may be shorter than the width (h) as with the slots of the microwave supply means in the above described embodiments.

The generation of a plasma and the processing are carried out as follows. The article to be processed W is put on the article holding means 102 and is cooled to a desired temperature using the cooler 414. The inside of the plasma generation chamber 108 is evacuated via an exhaust system (24 to 26).

Subsequently, a plasma processing gas is supplied at a predetermined flow rate into the plasma generation chamber 109 using the gas supply means 107. Then, a conductance control valve 26 provided in the exhaust system (24 to 26) is adjusted to maintain the inside of the plasma generation chamber 109 at a predetermined pressure. The RF bias application means 302 is used to supply an RF power to the holding means 102, while a desired power from a microwave power source 6 is introduced into the plasma generation chamber 109 through the dielectric window 104 via slots 203b of the microwave supply means 203. The electric field of the microwaves supplied to the inside of the plasma generation chamber 109 accelerate electrons to generate a plasma in the plasma processing chamber 109. At this time, the processing gas is excited by the high density plasma as generated to process the surface of the article to be processed W put on the holding means 102. In addition, the RF bias can be used to control the kinetic energy of ions incident to the article to be processed. Furthermore, the cooler 414 can be used to control the overheating of the article to be processed caused by ion incidence when a high density plasma and a high bias are used.

Figure 15:
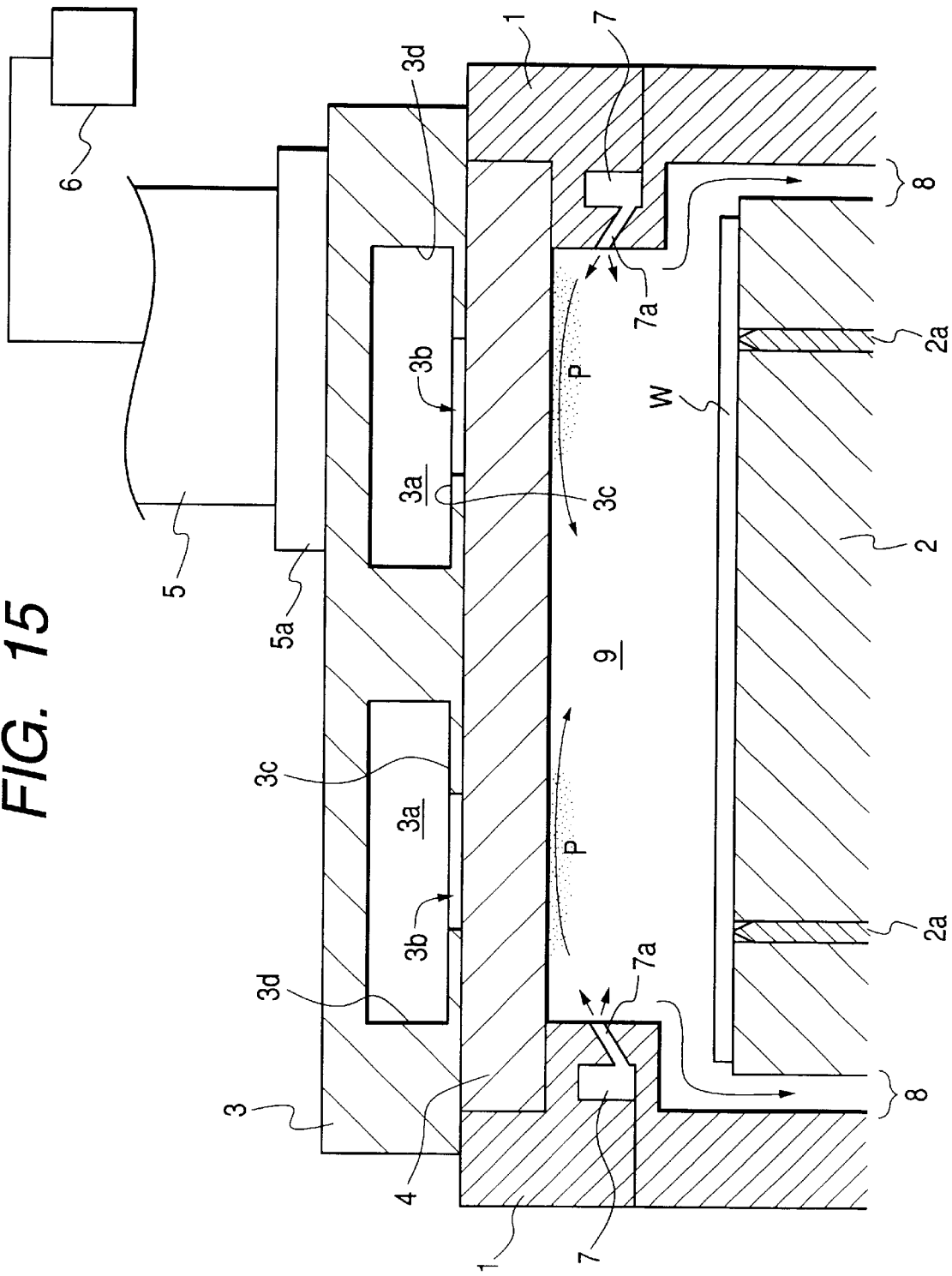
FIG. 15 is a schematic view showing yet again another plasma processing apparatus according to this invention.

FIG. 15 is a schematic sectional view showing a plasma processing apparatus of this invention.

Reference numeral 1 designates a vacuum container which can house the article to be processed W therein and generate a plasma in the plasma generation chamber 9 and is of an atmosphere-open-type.

Reference numeral 2 denotes an article-to-be processed holding means for housing the article to be processed W in the vacuum container 1 and holding the article, which has lift pins 2a that can elevate and lower the article to be processed W.

Reference numeral 3 indicates a microwave supply means for supplying microwave energy to generate a plasma in the vacuum container 1.

Reference numeral 4 designates a dielectric window that seals the inside of the vacuum container 1 airtight while passing microwaves through.

Reference numeral 5 denotes a microwave waveguide.

Reference numeral 6 indicates a microwave power source.

Reference numeral 7 designates a gas supply passage for supplying a processing gas to be converted into a plasma by microwaves, which obliquely extends upward and has a gas emission port 7a at the end thereof. The gas supply passage communicates with a gas supply system similar to the gas supply system (21 to 23) shown in FIGS. 11 to 14.

Reference numeral 8 denotes an exhaust passage for exhausting the inside of the vacuum container 1, and the exhaust passage communicates with an exhaust system similar to the exhaust system (24 to 26) shown in FIGS. 11 to 14.

The plasma processing method by the apparatus shown in FIG. 15 is described below.

The processing gas is supplied from the gas supply passage 7 to the inside of the vacuum container 1, which has been pressure-reduced and exhausted to a predetermined pressure.

The processing gas is emitted to the space 9 which forms a plasma generation chamber and then flows to the exhaust passage 8.

On the other hand, microwaves generated by the microwave power source 6 are propagated via a coaxial, cylindrical, or rectangular waveguide 5 and are supplied to the inside of the microwave supply means 3.

The microwaves propagate in the endless annular waveguide 3a of the microwave supply means 3.

Since longitudinal slots 3b crossing the traveling directions of the microwaves are provided in an H-plane 3c of the endless annular waveguide 3a, the microwaves are radiated toward the space 9 through the slots 3b.

The microwaves are supplied to the space 9 through a microwave transmission window 4a.

The processing gas present in the space 9 is excited by the microwaves to generate a plasma P.

The surface of the article to be processed W is subjected to a surface treatment using this plasma. The plasma P may be present only under the slots as shown in the figure or may spread all over the bottom surface of the dielectric window 4, depending on the power of supplied microwaves and the pressure in the container.

Figure 16:
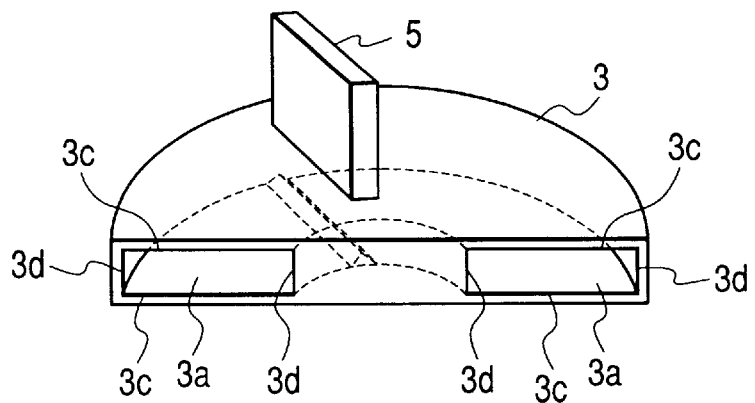
FIG. 16 is a schematic view showing an appearance and a cross section of the microwave applicator.

FIG. 16 is a schematic view showing the external appearance and cross section of the microwave applicator 3.

Figure 17:
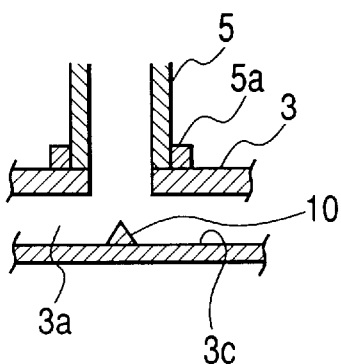
FIG. 17 is a schematic view showing a cross section of a microwave introducing section of the microwave applicator.

FIG. 17 is a sectional view of the connecting section (introducing section) between the microwave applicator 3 and the microwave waveguide 5.

Figure 18:
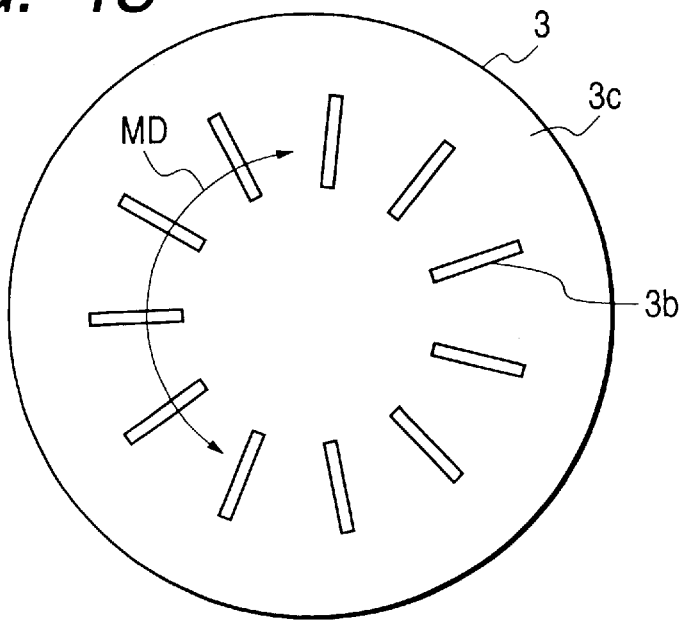
FIG. 18 is a schematic view showing a slotted H plane of the microwave applicator.

FIG. 18 shows the H-plane of the microwave applicator 3 in which the slots 3b are provided, as seen from below.

The microwave supply means 3 of the FIG. 15 is equivalent to a rectangular waveguide 3 that is bent like a ring so that the E plane 3d of the rectangular waveguide forms a curved surface. Thus, the two opposed H-planes are present within one and the same plane, respectively.

The microwaves, which have propagated through the waveguide 5 in, for example, $TE_{10}$ mode, are distributed in opposite directions by a microwave distributor 10 such as an E branching block which is located at the connecting section.

The microwaves propagate through the endless annular waveguide 3a while being emitted through the slots 3b extending in the direction crossing the traveling directions MD of the microwaves.

Such a microwave supply means is called an planar slotted annular waveguide or a planar multi-slot antenna (PMA).

In the endless annular waveguide 3a, the microwaves travel and propagate while being attenuated due to the emission of their energy through the slots. Furthermore, since the traveling direction of the microwaves is bidirectional, the traveling microwaves interfere with each other to radiate microwaves of a uniform intensity to the space 9.

Then, another microwave applicator according to a preferred embodiment of this invention is described.

Figure 19A:
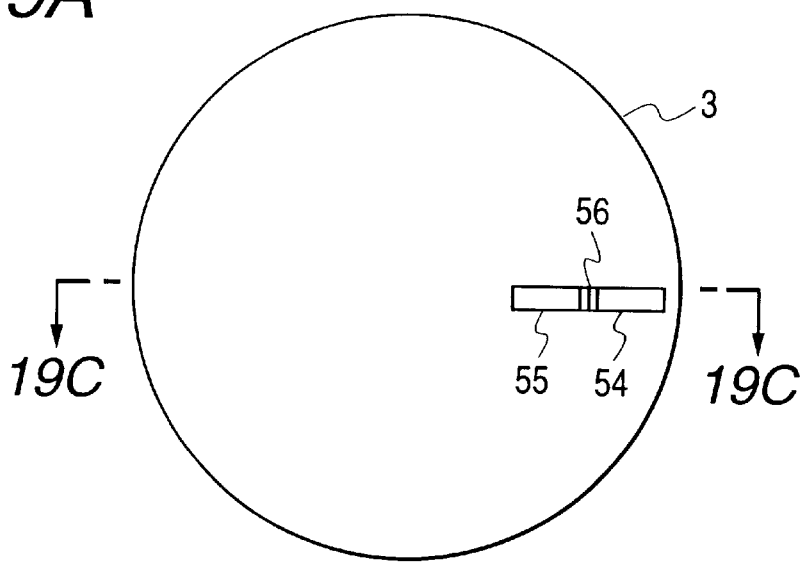
FIGS. 19A, 19B and 19C are schematic views showing a microwave applicator according to another embodiment of this invention.
Figure 19B:
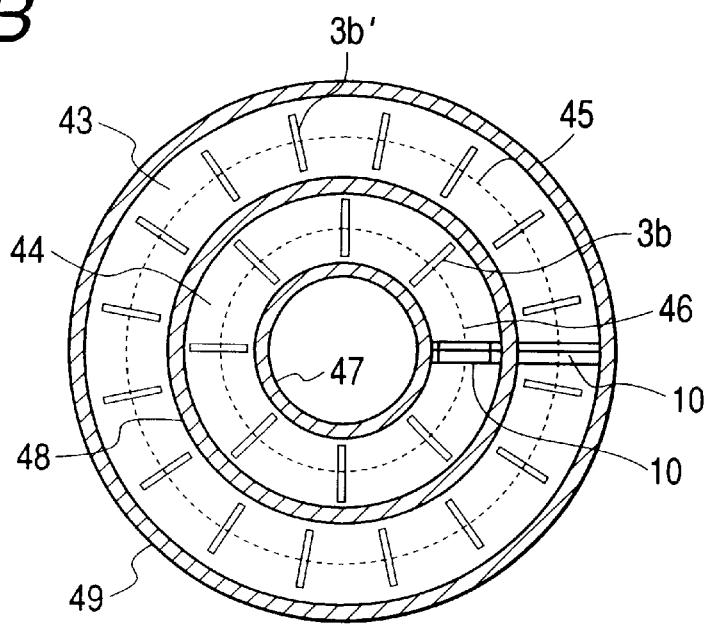
Figure 19C:
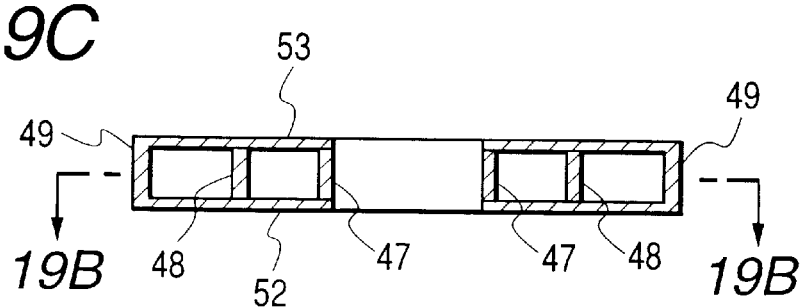

FIG. 19A shows the appearance of the top surface of the microwave applicator 3, FIG. 19B shows its horizontal sectional view, and FIG. 19C shows its longitudinal sectional view.

The microwave applicator 3 has a plurality of annular waveguides 43 and 44 having different diameters.

The outer annular waveguide 43 of a larger diameter is composed of an outer wall 49 forming an E plane, an inner wall 48 forming another E plane, a planar top wall 53 forming an H-plane, and a planar bottom wall 52 forming another H-plane. A plurality of slots 3b' are provided in the bottom wall 52.

The inner annular waveguide 44 of a smaller diameter is similarly composed of an inner-most wall 47 forming an E plane, the inner wall 48, the top wall 53, and the bottom wall 52. A plurality of slots 3b are provided in the bottom wall 52.

The annular waveguides 43 and 44 have a similar configuration to the annular waveguide 3a (see FIG. 1 and others) according to the above embodiments, and each have a rectangular cross section so as to propagate microwaves in TE mode, as shown in FIG. 19C.

Reference numeral 54 designates a microwave introducing port to the outer annular waveguide 43 which preferably has a rectangular cross section of the same size as that of the cross section of the waveguide 43.

Reference numeral 55 designates a microwave introducing port to the inner annular waveguide 44 which preferably has a rectangular cross section of the same size as that of the cross section of the waveguide 44.

Each waveguide is preferably annular and has no terminal planes.

Although the example in FIG. 19 is configured by integrating the two waveguides together, individual annular waveguides may be concentrically arranged on a certain support base, a builtup member comprising a flat plate with slots and a component member having a plurality of annular grooves forming waveguides is applicable, as described above.

When the microwave applicator is composed of the builtup member, the flat plate with slots for the outer annular waveguide 43 may be separated from the flat plate with slots for the inner annular waveguide 44. Further, by preparing a large number of interchangeable flat plates with slots having different shapes, numbers, sizes, and distributions of slots as is the case with the embodiment in FIGS. 5A to 5C, a microwave applicator suitable to a desired microwave radiant intensity distribution can be simply produced.

The shape of the annular waveguides 43 and 44 is not limited to a circle such as shown in FIGS. 19A to 19C, but it may be a rectangle as with the embodiment in FIGS. 6A and 6B, or a polygon or a star.

The slots provided in the outer and the inner annular waveguides 43 and 44 may have the same or different shapes, numbers, sizes, and distributions. Except for applications to special plasma processing, the apparatus can be designed more easily when the number of slots 3b of the inner waveguide 44 is smaller than that of the slots 3b' of the outer waveguide 43.

To simplify the configuration of the apparatus so that it requires only a single microwave power source, an electromagnetic wave distribution and introducing means 56 is preferably arranged in the vicinity of the microwave introducing ports 54 and 55, and an H branching device is preferably added which is used to determine the distribution ratio of microwaves.

Microwaves are introduced into the microwave introducing ports 54 and 55 in, for example, $TE_{no}$ mode.

The microwaves introduced into the annular waveguides 43 and 44 are each distributed in the opposite directions by the distributors 10 and propagate through the waveguides 43 and 44 clockwise and counterclockwise in the $TE_{no}$ mode.

During propagation, the microwaves are emitted to the exterior through the slots 3b, 3b' of the H-planes.

The microwaves, which have propagated in the opposite directions, interfere with each other in the waveguides 43 and 44 and may generate standing waves to stabilize the radiant intensity of microwaves from the slots.

Thus, according to the microwave applicator of this invention, it is possible to radiate microwaves of a large area and a relatively uniform intensity distribution substantially in a plane form.

Here, a microwave applicator of a builtup type, and an electromagnetic wave distribution and introducing means, and a plasma processing apparatus using the same are described below with reference to FIGS. 20 to 23.

Figure 20:
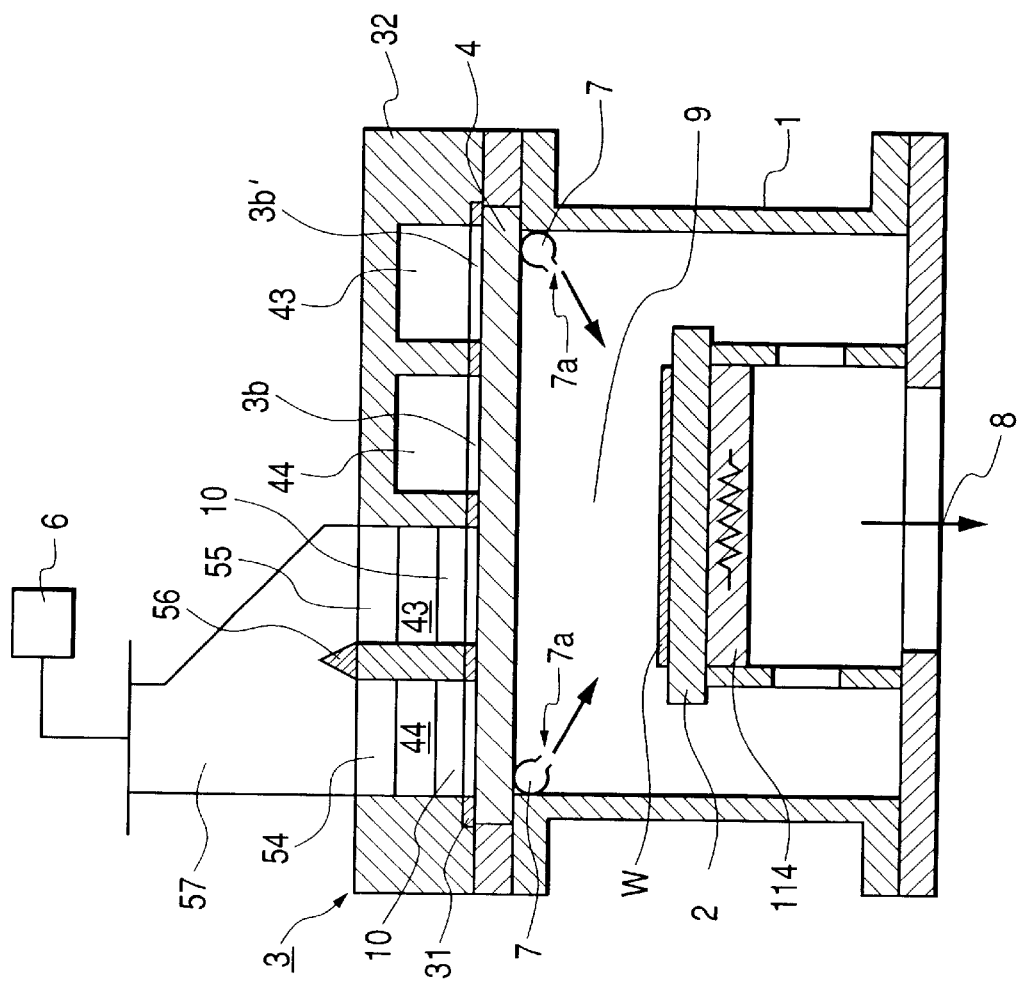
FIG. 20 is a schematic view showing a microwave applicator according to another embodiment of this invention and a plasma processing apparatus using the applicator.

In FIG. 20, 1 is a container that forms a plasma generation chamber 9; 4 is a dielectric window; 3 is a planar slotted multiple annular waveguide as a microwave supply means for supplying microwaves to the plasma generation chamber 9; 57 is a waveguide that introduces microwaves into the endless annular waveguide 3; W is an article to be processed; 2 is a means for holding the article to be processed W; 7 is a processing gas supply means; and 8 is an exhaust port.

Figure 21:
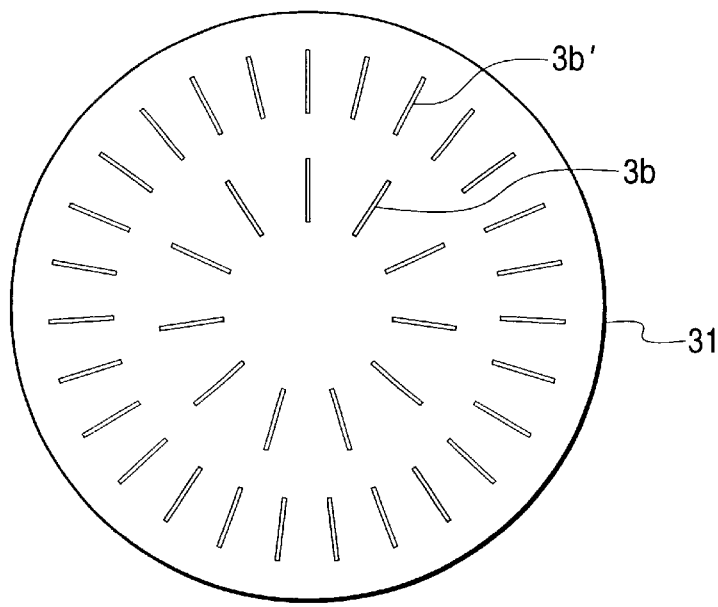
FIG. 21 is a schematic view showing an example of a layout of slots used for multiple annular waveguides according to another embodiment of this invention.
Figure 22A:
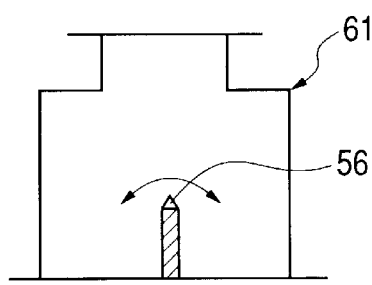
FIGS. 22A, 22B, 22C and 22D are schematic views showing various structures of a microwave distributing and introducing means used in this invention.
Figure 22B:
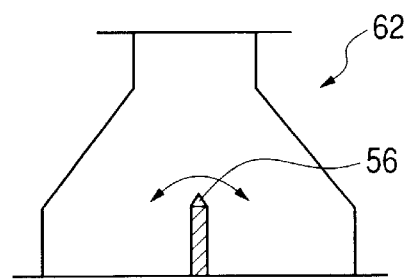
Figure 22C:
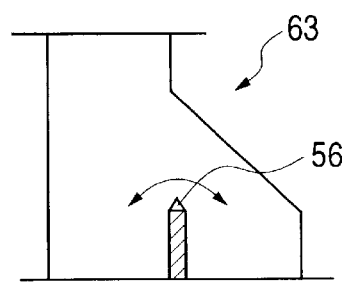
Figure 22D:
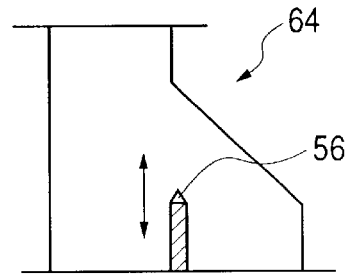

The microwave applicator is a builtup member of a first conductive member 32 with grooves and a second conductive member 31 consisting of a flat plate with slots 3b and 3b' such as shown in FIG. 21.

Further, there is provided in the vicinity of the microwave introducing ports 54 and 55 a distributor 56 for determining the ratio of distribution of microwaves to the waveguides 43 and 44. In the apparatus of FIG. 20, the electromagnetic wave distribution and introducing means comprises the waveguide 57 having a branching passage and a distributor 56 such as an H branching device.

In FIG. 20, the distributor 56 is configured as a conductor of a triangular section having at least two distributing surfaces. The distributor 56, however, is not limited to this configuration but may be a plate-like member.

In addition, the distributor can be configured to vary the distribution ratio.

Examples of an H branching device having a distribution mechanism for the waveguides 43 and 44 used in this invention. Reference numeral 61 shows a device in which a plate-like or triangle pole-like movable distributing block 56 is provided in the center of a T-shaped branch. Reference numeral 62 shows a device in which the branching portion of a Y-shaped branch can be rotatably moved. Reference numeral 63 shows a device in which the branching portion of a modified Y-shaped branch can be rotatably moved, and 64 shows a device in which the branching portion of a modified Y-shaped branch can be extended and shortened. The distributor 56 is applicable as long as it has small reflection in the microwave incidence direction and as long as it can adjust the distribution ratio of one to the other at least between 0.2 and 0.5, preferably between 0.0 and 0.6. In the case of the type in which the distributor 56 can be extended and shortened, for example, a screw can be used and its height can be adjusted by adjusting its tightening amount, thereby attaining a distribution-ratio-changeable distributor that can be simply extended and shortened.

Figure 23:
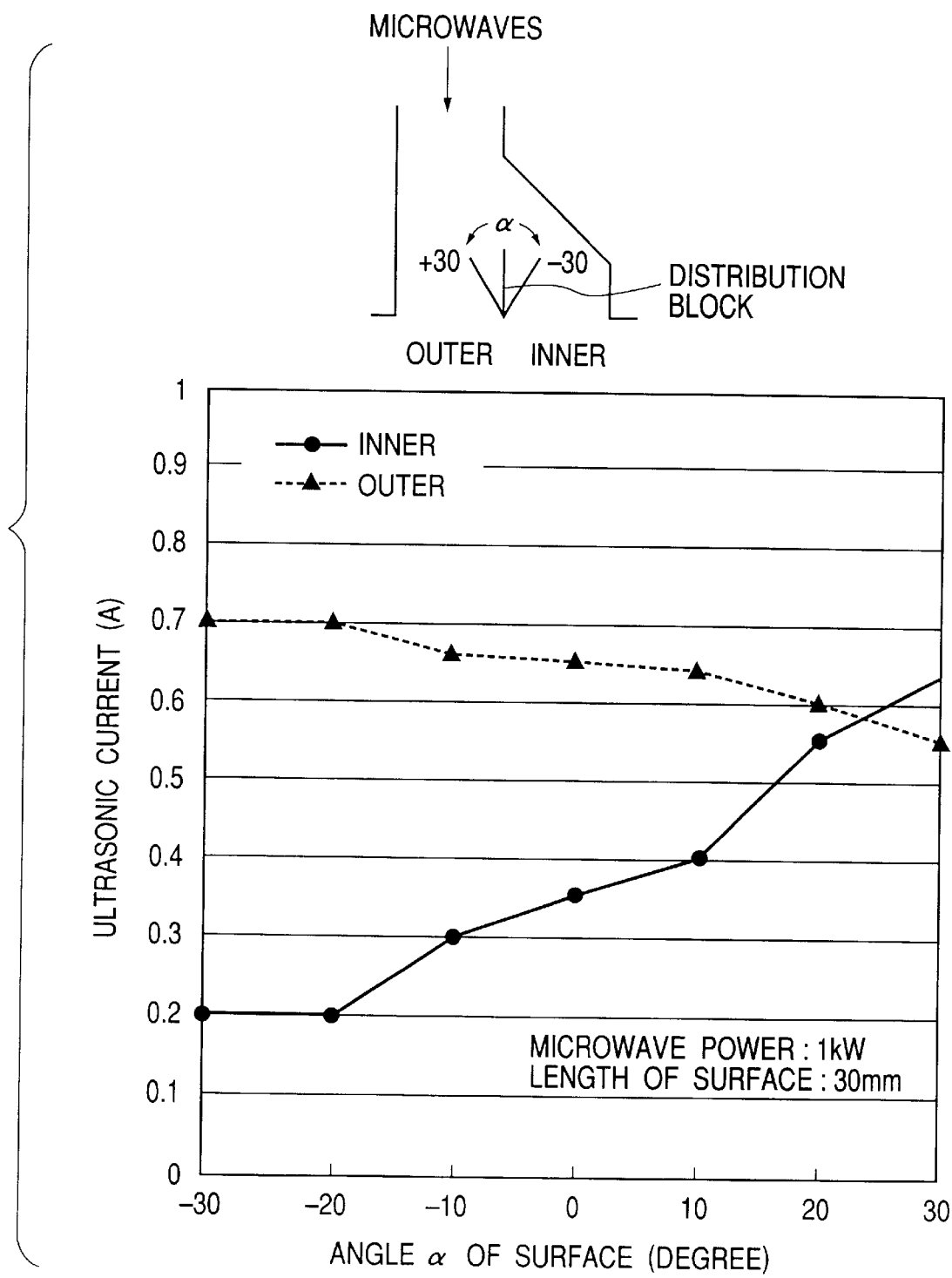
FIG. 23 is a graph showing changes in microwave radiant intensity vs. the tilt angle of a distributor.

By way of example, FIG. 23 shows the relationship between the intensity of microwaves vs. the tilt angle of a distributor of a tilt-type in which the movable part can be rotated. The distribution ratio of this distributor was such that when the inner side was assumed to be 1, the outer side could be varied between about 0.9 and about 3.5. Of course, when the distribution ratio is desired to be varied, the length or rotational angle of the distributing block or the shape of the triangle pole can be changed suitably.

The H branching device having a mechanism for adjusting the distribution ratio of electromagnetic waves is used not only for a plasma processing apparatus but also in other cases in which the distribution ratio of electromagnetic waves need not be adjusted.

On the other hand, the E branching device 10 of the annular waveguides 43 and 44 may be omitted.

The material of the members forming the H and the E branching device and the multiple annular waveguide according to this invention described above is the same as that of the component members of the single annular waveguide described above and may be any conductor available. Further, in order to minimize the propagation loss of microwaves, metals of a high conductivity, for example, Al, Cu, Ag/Cu-plated stainless steel can be used as optimally. As to the orientation of the introducing ports with regard to the multiple endless annular waveguide used in this invention, microwaves may be introduced parallel to the H-plane in a tangential direction or may be introduced perpendicularly to the H-plane, followed by the two-way distribution in the vicinity of the introducing section to the inner and outer waveguides, as long as the orientation attains efficient introduction of microwaves into the microwave propagation space in the multiple annular waveguide.

The shape of the slots provided in each of the multiple annular waveguides used in this invention is the same as that of the slots of the single annular waveguide described above, and may be any one of a rectangle, an ellipse, the character S, a cross, an array, and so on, as long as the length thereof in the direction perpendicular to the propagation direction of the microwave is ¼ or more of the guide wavelength.

The interval and size of the slots of the multiple annular waveguides used in this invention are selected and designed as with the single annular waveguide described above.

Although the rectangular cross sections of the annular waveguides may have different areas, but it is desirable to select waveguides in which the cross sections perpendicular to the traveling direction of microwaves have the same rectangle section so that microwaves of the same mode can be propagated therethrough.

Further, the radiant intensity of microwaves is desirably adjusted in terms of the arranging density of slots.

According to the microwave applicator and the plasma processing apparatus using the same according to the present embodiment, by using a multiple annular waveguide in which a plurality of annular waveguides of different sizes are concentrically arranged and slots are provided in the plane portion thereof, it is possible to generate a large-area plasma suitable for the processing of a large-area article to be processed such as wafers of 300 mm diameter or substrates equivalent to such wafers. This makes it possible to perform processing of a higher quality at lower temperatures more uniformly.

In particular, by providing a plurality of annular waveguides in such a way that the H-planes of the annular waveguides are coplanar to one another, it is possible to efficiently generate a high-density, low-potential plasma uniformly even under a high pressure condition or even when a large-area article is to be processed. In addition, such effects can be achieved without the use of a magnetic field.

(Sixth Plasma Processing Apparatus)

A plasma processing apparatus using a multiple endless annular waveguide as the microwave supply means according to this invention is described with reference to FIG. 20.

Reference numeral 1 is a plasma processing chamber; 4 is a dielectric window that separates the plasma processing chamber 109 from the atmosphere; 3 is multiple endless annular waveguides for supplying microwaves to the plasma processing chamber 101; 56 is an H branching device having a distribution rate adjustment mechanism for distributing and introducing microwaves to the multiple endless annular waveguides 3; 43 and 44 are waveguides that are microwave propagation spaces through which microwaves propagate; 3b and 3b' are slots through which microwaves are supplied to the inside of the plasma generation chamber 9 from the multiple endless annular waveguides 3; W is an article to be processed; 2 is a means for holding the article to be processed W; 114 is a heater that heats the article to be processed W; 7 is a processing gas introducing means; and 8 is an exhaust port. It is more preferred that the gas emission port 7a is directed to the H-place.

The generation of a plasma and the processing are carried out as follows. The article to be processed W is put on the article holding means 2 and is heated to a desired temperature using the heater 114 as required. The inside of the plasma generation chamber 9 is evacuated via an exhaust system (not shown).

Subsequently, a plasma processing gas is emitted at a predetermined flow rate into the plasma generation chamber 9 through the gas emission port 7a. Then, a conductance control valve (not shown) provided in the exhaust system (not shown) is adjusted to maintain the inside of the plasma generation chamber 9 at a predetermined pressure. A desired power from a microwave power source 6 is introduced into the annular waveguides 43 and 44 through the H branching device 56 with a distribution rate adjustment mechanism. The introduced microwaves are divided into two by the H branching device 56 and then propagate through the waveguides 43 and 44 as the propagation spaces, clockwise and counterclockwise several rounds.

The microwaves, which have been divided into two, interfere with each other to strengthen the electric field that crosses the slots 3b and 3b' provided at an interval of, for example, ½ of the guide wavelength, and are then supplied to the plasma generation chamber 9 via the slots 3b and 3b' through the dielectric window 4. The electric field of the microwaves supplied to the inside of the plasma generation chamber 9 accelerate electrons to generate a plasma in the plasma processing chamber 9. At this time, the processing gas is excited by the high density plasma as generated to process the surface of the article to be processed W put on the holding means 2.

As the dielectric window 4, one formed of, for example, synthetic quartz and having a diameter 299 mm and a thickness 12 mm is used. The endless annular waveguides 43 and 44 have a 27 mm×96 mm inner wall cross section perpendicular to the traveling direction of the microwaves. The central diameter of the inner annular waveguide 44 is 152 mm (circumferential length: 3 $\lambda$g) and the central diameter of the outer annular waveguide 43 is 354 mm (circumferential length: 7 $\lambda$g). As the material of the component members 31 and 32 of the multiple endless annular waveguide, Al as a conductor is entirely, in order to suppress the propagation loss of microwaves.

In the component member 31 forming the H-plane of the multiple endless annular waveguides 3, are formed slots for supplying microwaves to the plasma generation chamber 9. The shape of slots is a rectangle of 45 mm in length and 4 mm in width and the slots are formed radially at an interval of ½ of the guide wavelength. Although the guide wavelength depends on the frequency of microwaves used and the size of the cross section of the waveguide, the use of microwaves of a frequency 2.45 GHz and a waveguide of the above mentioned size provides a guide wavelength of about 159 mm. In the multiple endless annular waveguide 3 of FIG. 20, 6 slots are formed in the inner waveguide, and 14 slots are formed in the outer waveguide at an interval of about 79.5 mm. To the multiple endless annular waveguide 3, is connected a microwave power source 6 of a frequency 2.45 GHz additionally provided with a 4E tuner, a directional coupler, and an isolator.

The microwave plasma processing apparatus shown in FIG. 20 was used to generate a plasma under the conditions of an Ar flow rate of 500 sccm, pressures of 10 mTorr and 1 Torr, and a microwave power of 1.5 kW, and the plasma obtained was measured. The plasma was measured as follows using a single probe method. The voltage applied to the probe was varied within a range of −50 V to +100 V, and a current flowing through the probe was measured by an I-V measuring apparatus. The electron density, the electron temperature and the plasma potential were calculated from the thus obtained I-V curve by the Langmuir method. As a result, the electron density was $1.1 \times 10^{12}/cm^3$ ±2.7% (within a $\phi$ 300 surface) at 10 mTorr and $5.7 \times 10^{11}/cm^3$ ±4.2% (within a $\phi$ 300 surface) at 1 Torr, and it was confirmed that a high density, uniform plasma was formed in the space of a large diameter.2

(Seventh Plasma Processing Apparatus)

Figure 24:
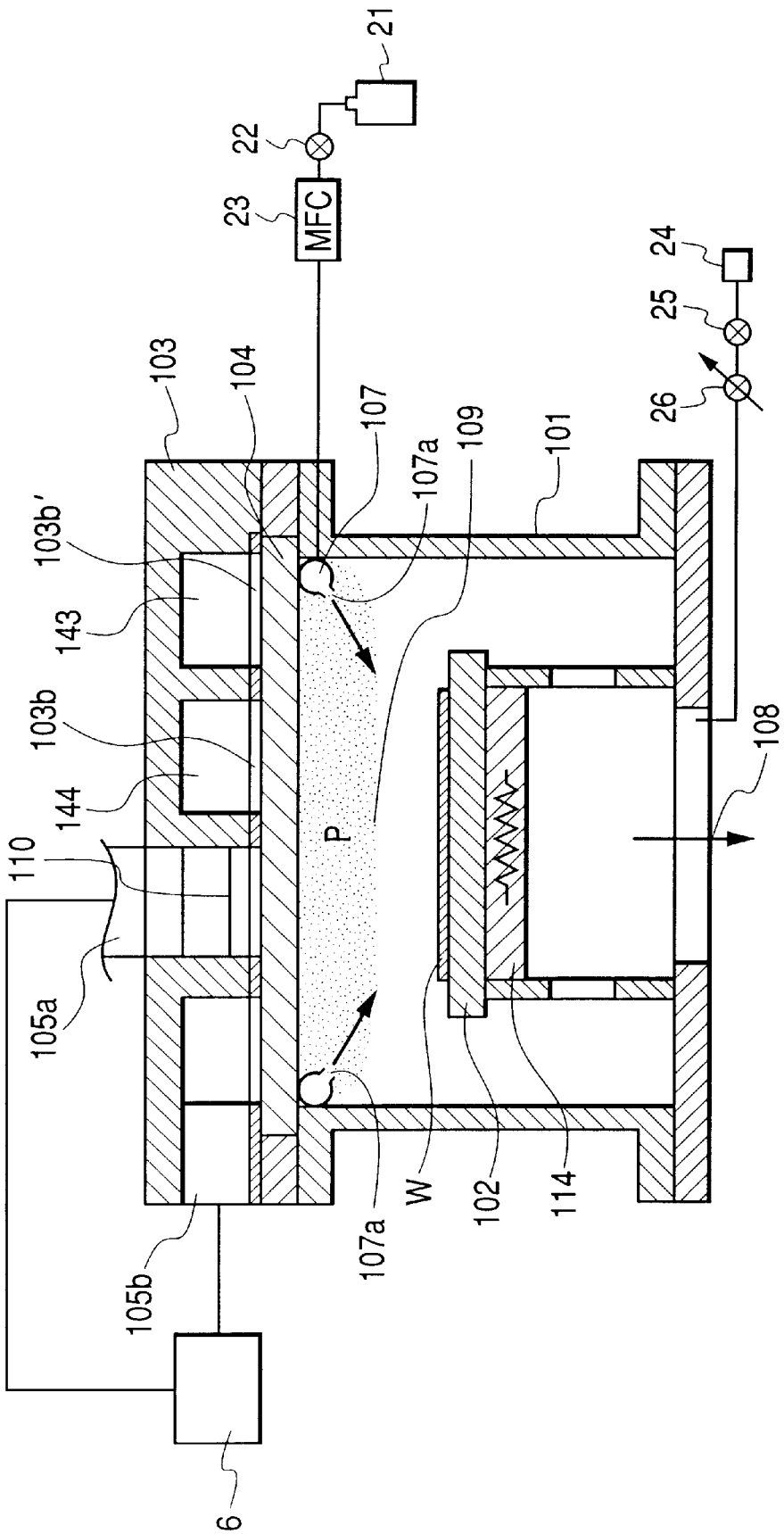
FIG. 24 is a schematic view of another plasma processing apparatus according to this invention.

FIG. 24 shows a plasma processing apparatus of a system that introduces microwaves into one waveguide 143 of a multiple annular waveguide in a tangential direction while introducing microwaves into the other waveguide 144 toward the distributor 110.

Reference numeral 101 designates a vacuum container having a plasma generation chamber 109 inside, and 102 is a holding means for loading and holding an article to be processed W, which has a heater 114 as required.

Reference numeral 103 is a microwave supply means having a plurality of annular waveguides 143 and 144 as with the example of FIG. 20. The annular waveguides form a multiple endless annular waveguide having slots 103b and 103b' in the H-plane thereof.

Microwaves from the microwave power source 6 are introduced into the waveguides 103b' and 103b through a tangential introducing port 105b and a normal introducing port 105a. The microwaves are radiated to the inside of the chamber 109 via the slots 103b and 103b' through the dielectric window 104.

The plasma processing method carried out by this apparatus is described below. The article to be processed W is placed on the holding means 102 and heated to a predetermined temperature using the heater 114.

On the other hand, an exhaust system (24, 25, 26) is used to exhaust the inside of the container 101.

Subsequently, a gas is introduced into the supply means 107 from a gas supply system (21, 22, 23) and is then emitted through the gas emission port 107a. It is more preferable that the gas emission port 107a is directed to the H-plane. Then, the conductance control valve 26 of the exhaust system (24, 25, 26) is adjusted to maintain the inside of the chamber 109 at a predetermined pressure.

A desired power from a microwave power source 6 is introduced into the multiple endless annular waveguides 103. The introduced microwaves are supplied to the inside of the plasma generation chamber 109 through the dielectric window 104 via the slots 103b and 103b' formed at an interval of ½ or ¼ of the guide wavelength. Microwaves that have propagated through the waveguide one round without being emitted from the slots after the tangential introduction interfere with newly introduced microwaves to strengthen each other, and most of the microwaves are emitted to the inside of the plasma generation chamber 109 before they have propagated through the waveguides several rounds.

The electric field of the microwaves introduced into the plasma generation chamber 109 accelerate electrons to generate a plasma in the plasma generation chamber 109. At this time, the process gas is excited by the high density plasma as generated to process the surface of the article to be processed W put on the holding means 102.

The shape, size, and material of the dielectric window 104 are the same as those of the dielectric window 4 of FIG. 20.

The shape and size of the waveguides 143 and 144 and the shape, size, and arrangement density of the slots 103b and 103b' are the same as those of the corresponding components in FIG. 20.

The microwave plasma processing apparatus shown in FIG. 24 was used to generate a plasma under the conditions of an Ar flow rate of 500 sccm, pressures of 10 mTorr and 1 Torr, and a microwave power of 1.5 kW, and the plasma obtained was measured. The plasma was measured as follows using a single probe method. The voltage applied to the probe was varied within a range of −50 V to +100 V, and a current flowing through the probe was measured by an I-V measuring apparatus. The electron density, the electron temperature and the plasma potential were calculated from the thus obtained I-V curve by the Langmuir method.

As a result, the electron density was $1.3 \times 10^{12}/cm^3$ ±3.3% (within a ϕ 300 surface) at 10 mTorr and $6.2 \times 10^{11}/cm^3$ ±4.6% (within a ϕ 300 surface) at 1 Torr, and it was confirmed that a high density, uniform plasma was formed in the space of a large diameter.

(Eighth Plasma Processing Apparatus)

Figure 25:
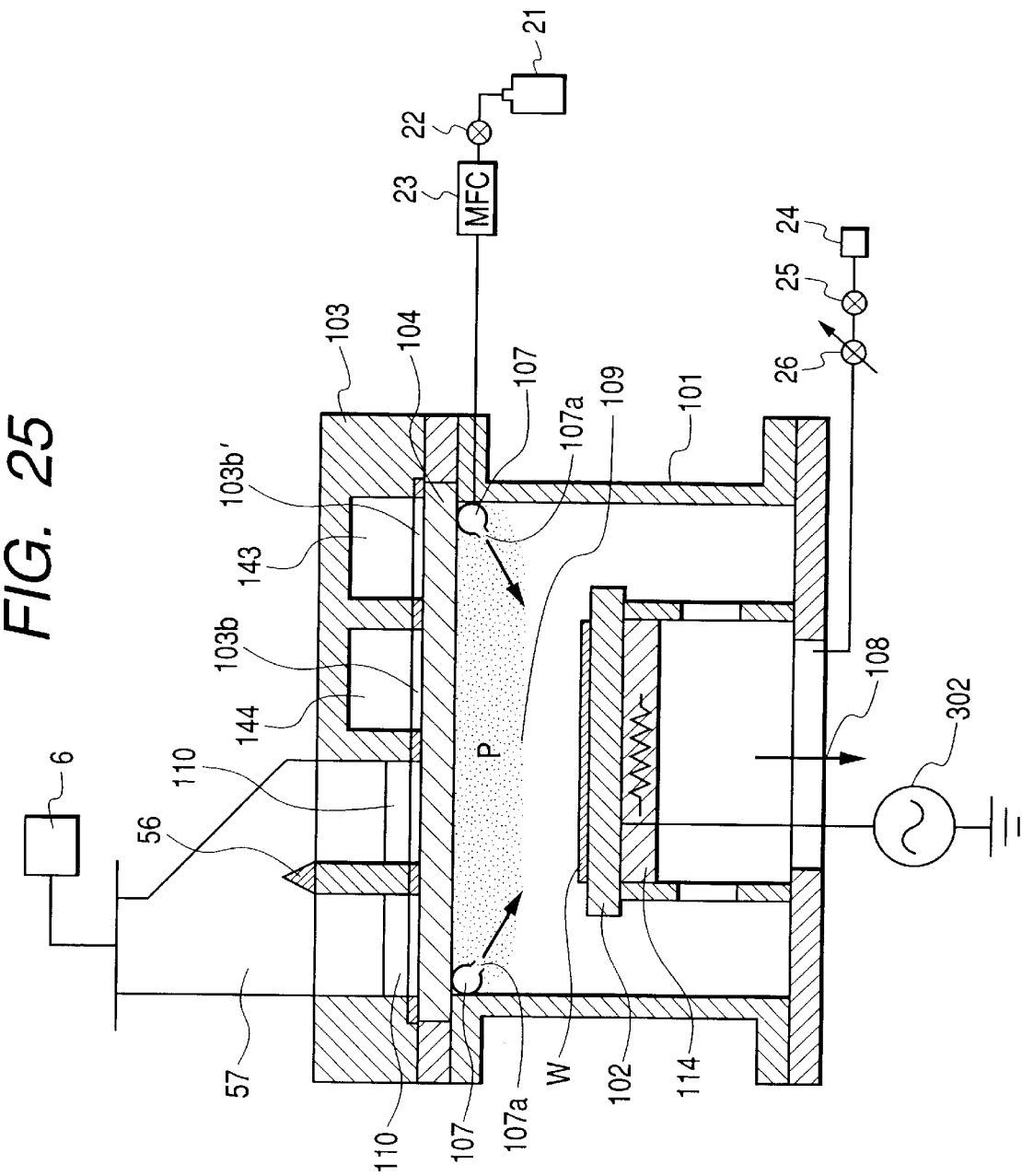
FIG. 25 is a schematic view of yet another plasma processing apparatus according to this invention.

The plasma processing apparatus shown in FIG. 25 is the same as the apparatus shown in FIG. 20 except that a bias application mechanism 302 for applying an RF bias is added to the holding means 102.

The generation of a plasma and the processing are carried out as follows. The article to be processed W is put on the article holding means 102 and is heated to a desired temperature using the heater 114. The inside of the plasma generation chamber 109 is evacuated via the exhaust system (24 to 26).

Subsequently, a plasma processing gas is emitted at a predetermined flow rate into the plasma generation chamber 109 via the processing gas emission port 107a.

Then, the conductance control valve 26 provided in the exhaust system (24, 25, 26) is adjusted to maintain the inside of the plasma generation chamber 109 at a predetermined pressure. The RF bias application means 302 is used to supply an RF power to the holding means 102, while a desired power from the microwave power source 6 is supplied through the waveguide 57 toward the H branching device 56 having a distribution rate adjustment mechanism. The distributed microwaves propagate through the waveguides 143 and 144, respectively, and are then supplied to the plasma processing chamber 109 via the slots 103b and 103b' through the dielectric window 104. The electric field of the microwaves introduced into the plasma generation chamber 109 accelerate electrons to generate a plasma in the plasma processing chamber 109.

At this time, the process gas is excited by the high density plasma as generated to process the surface of the article to be processed W put on the holding means 102. In addition, the RF bias can be used to control the kinetic energy of ions incident to the article to be processed.

(Ninth Plasma Processing Apparatus)

Figure 26:
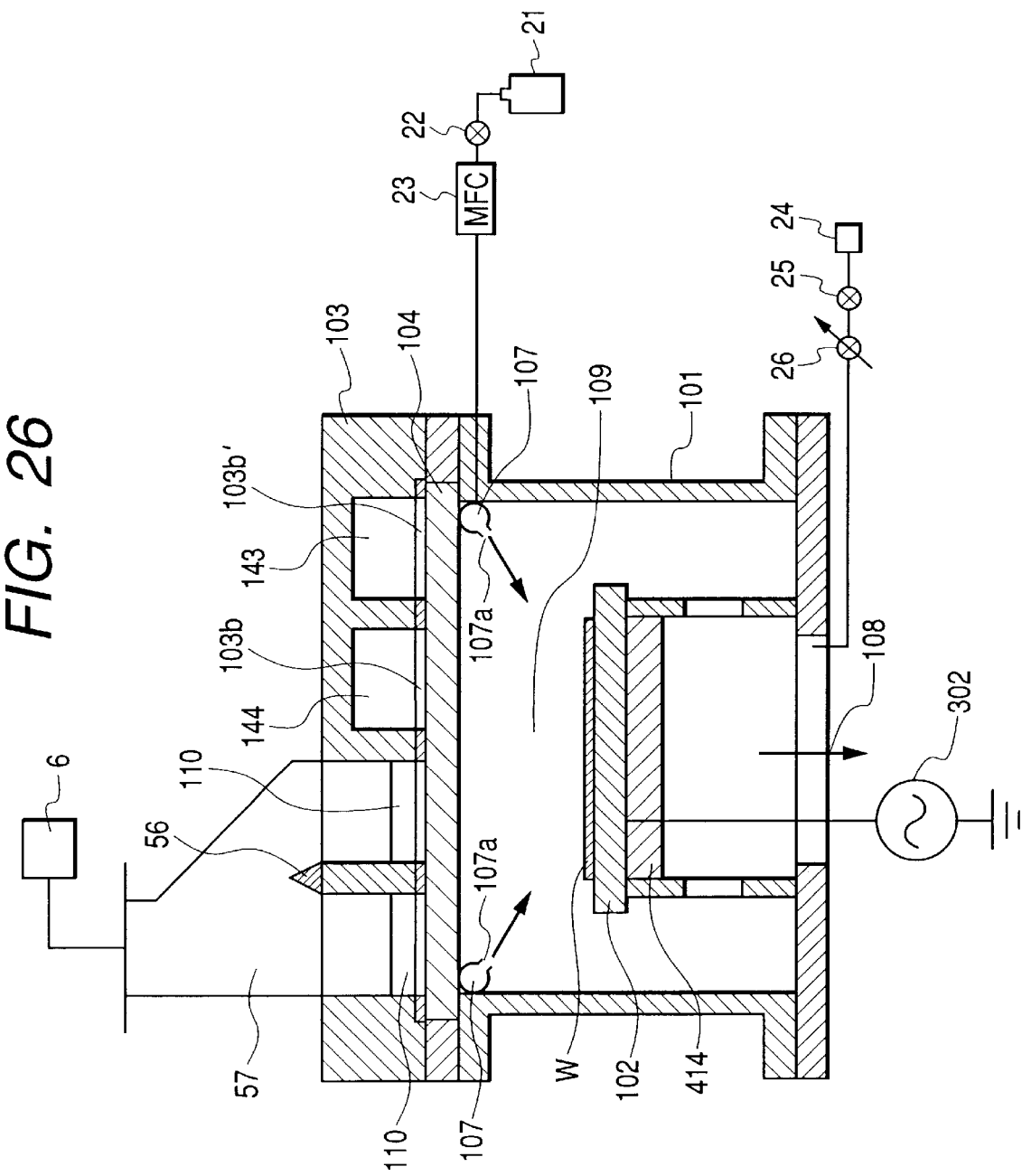
FIG. 26 is a schematic view of still another plasma processing apparatus according to this invention.

The plasma processing apparatus shown in FIG. 26 is the same as the apparatus shown in FIG. 25 except that a cooler 414 as a cooling means is provided.

The generation of a plasma and the processing are carried out as follows. The article to be processed W is put on the article to be processed holding means 102 and is cooled by the cooler 414. The inside of the plasma generation chamber 109 is evacuated via the exhaust system (24, 25, 26).

Subsequently, a plasma processing gas is emitted at a predetermined flow rate into the plasma generation chamber 109 via the processing gas emission port 107a.

Then, the conductance control valve 26 provided in the exhaust system (24, 25, 26) is adjusted to maintain the inside of the plasma generation chamber 109 at a predetermined pressure. The RF bias application means 302 is used to supply an RF power to the holding means 102, while a desired power from the microwave power source 6 is supplied to the plasma generation chamber 109 through the dielectric window 104 via the H branching device 56 with a distribution rate adjustment mechanism and the slots 103b and 103b' of the multiple endless annular waveguides 103. The electric field of the microwaves introduced into the plasma generation chamber 109 accelerate electrons to generate a plasma in the plasma processing chamber 109.

At this time, the process gas is excited by the high density plasma as generated to process the surface of the article to be processed W that is put on the holding means 102 having the cooler 414 and is prevented from temperature increase.

In addition, the RF bias can be used to control the kinetic energy of ions incident to the article to be processed. Furthermore, use of the cooler 414 can prevent the article from being overheated by ion incidence when a high density plasma and a high bias are used.

(Tenth Plasma Processing Apparatus)

Figure 27:
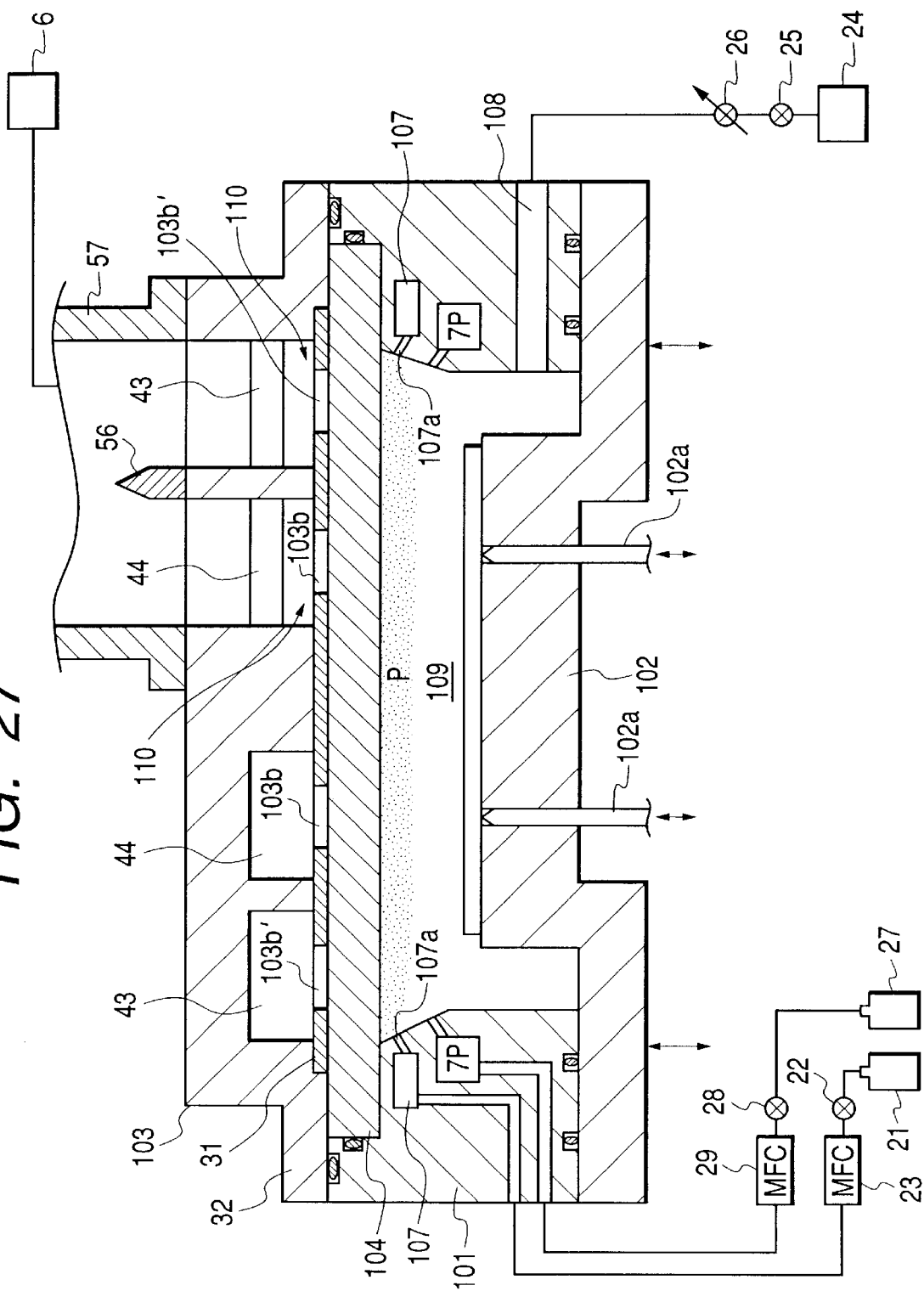
FIG. 27 is a schematic view of yet still another plasma processing apparatus according to this invention.
Figure 28:
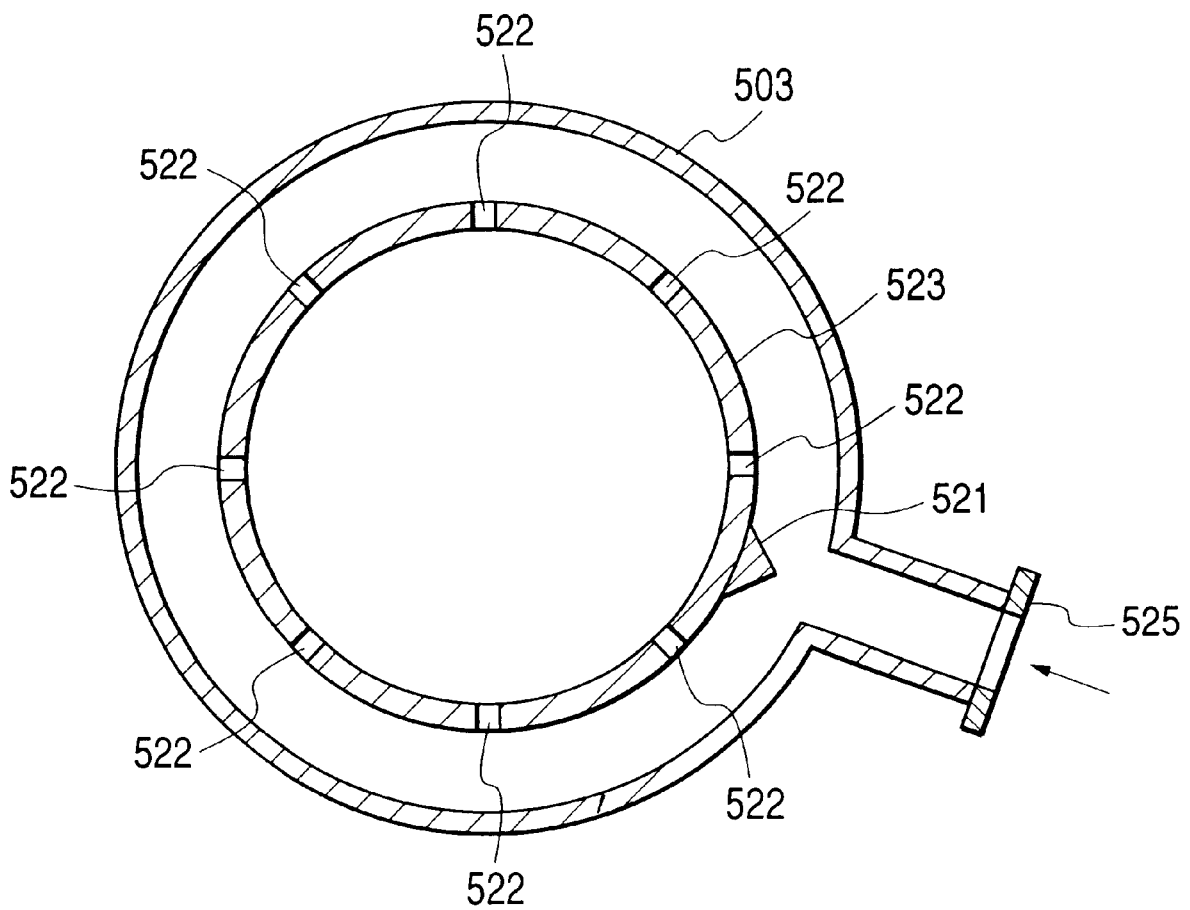
FIG. 28 is a schematic horizontal sectional view of a conventional microwave applicator.
Figure 29:
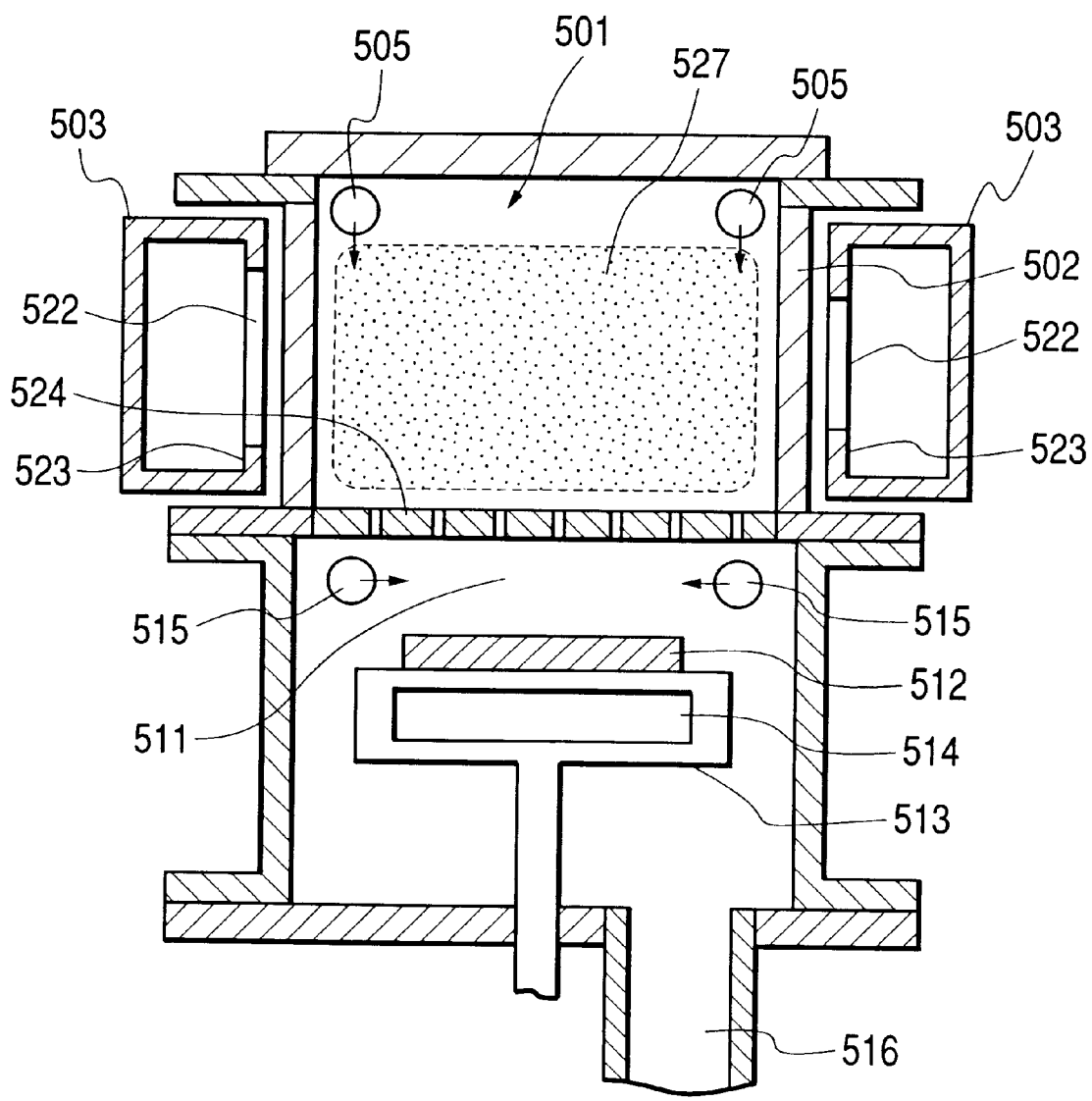
FIG. 29 is a schematic longitudinal sectional view of a conventional microwave plasma processing apparatus.

The plasma processing apparatus shown in FIG. 27 has a microwave applicator 103 with two endless annular waveguides 43 and 44 concentrically disposed as with the apparatuses described above.

The microwave applicator 103 is a builtup member of a conductive member 32 with grooves and a planar conductive member 31 having slots 103b and 103b'.

An H branching device 56 is provided in the vicinity of a microwave introducing port so that its installation angle can be adjusted.

Microwaves introduced from a waveguide 57 are distributed by the H branching device 56 to the inner waveguide 44 and the outer waveguide 43 and introduced.

In each of the waveguides 43 and 44, the microwaves are distributed by the distributor 110 clockwise and counter-clockwise and then propagate through the endless waveguides 43 and 44 and interfere with each other. The microwaves introduced into the waveguides 43 and 44 are supplied to the inside of a plasma generating and processing chamber 109 of a container 101 from the slots 103b and 103b' through a dielectric window 104. As the microwaves propagate through the annular waveguides 43 and 44 two or three rounds, the microwaves attenuate such that they can no longer generate a plasma.

In the chamber 109 are provided a plurality of gas emission ports 107a of a gas supply means 107.

A gas is emitted toward the dielectric window 104 from the gas emission ports 107a located at the ends of gas emission passages obliquely extending upward.

Since the plurality of emission ports 107a are provided obliquely in the inner wall at the circumference of the container 101, the gas is emitted toward the center of the chamber 109 via a plasma region P. The structure of the gas emission ports 107a can be selected and designed as is the case with the embodiments shown in FIGS. 1, 2, 6A and 6B, and 9A and 9B.

Reference numeral 7P designates a purge gas supply means, and an emission port located at the end of a gas emission passage obliquely extending upward is directed toward the dielectric window 104. The purge gas supply means 7P is connected to a supply system (27 to 29) for a purge gas such as nitrogen, argon, or the like, and the purge gas in a bomb 27 is supplied to the inside of the chamber via a valve 28 and a mass flow controller 29.

The process using the apparatus shown in FIG. 27 is carried out as follows.

First, a holding means 102 is lowered and the container is opened.

Lift pins 102a are elevated and an article to be processed W is put on the pins.

The lift pins 102a are lowered to dispose the article to be processed W directly on the holding means 102. The holding means 102 is elevated and the container is closed.

A vacuum pump 24 is operated to exhaust the inside of the container via an exhaust port 108 to reduce the pressure.

A processing gas is supplied at a predetermined flow rate to the inside of the container through a gas supply system (21 to 23). Thus, the processing gas is emitted from the plurality of gas emission ports 107a toward the H-plane with slots.

A microwave power source 6 is operated to supply microwaves to a microwave applicator 103. In this time, the microwaves are supplied in $TE_{10}$ mode, and the power is set at a sufficient value for the microwaves to propagate through the waveguides 43 and 44 two or three rounds, for example, 1.0 kW or more. Since the value of the power depends on the circumferential length of the waveguide, the size of the slots, and so on, the above value is not so limitative.

The microwaves radiated through the slots 103b and 103b' are supplied to the plasma generation space 109 in the container 101 via the dielectric window to convert the processing gas into plasma. The radicals, ions, and electrons of the plasma are used to process the article W.

After processing has been finished, a purge gas is introduced to increase the pressure in the container up to the atmospheric pressure.

The holding means 102 is lowered to open the container, and the lift pins 102a are elevated to carry out the article to be processed W.

The present microwave plasma processing apparatus and method is specifically described below with reference to examples, but this invention is not limited to these examples.

EXAMPLE 1

The microwave plasma processing apparatus shown in FIG. 11 was used to carry out ashing of a photoresist.

The article to be processed W was an 8-inch silicon wafer immediately after a layer insulation film exposed via a photoresist pattern was etched to form via holes. First, the Si wafer was put on the holding means 102, and the inside of the plasma generation chamber 109 was evacuated via the exhaust system (24 to 26) to reduce the pressure down to $10^{-5}$ Torr. Oxygen gas was introduced at a flow rate of 2 slm into the chamber via the plasma processing gas supply means 107. Then, the conductance valve 26 provided in the exhaust system (24 to 26) was adjusted to maintain the inside of the generation chamber 109 at 2 Torr. The microwave power source 6 was used to introduce a microwave power of 2.45 GHz and 1.5 kW to the planar slotted annular waveguide 103 in the $TE_{10}$ mode. Thus, microwaves were radiated from the slots 103b to generate a plasma in the chamber 109. At this time, the oxygen gas introduced via the plasma processing gas supply port 107 was excited, decomposed, and reacted in the plasma generation chamber 109 to form ozone, which was then transported toward the Si wafer W to oxidize the photoresist on the surface of the Si wafer. Thus, the oxidized photoresist was vaporized and removed. After ashing, the ashing speed and the charge density on the surface of the wafer were evaluated.

The ashing speed obtained was as very high as 8.6 $\mu$m/min ±8.5%, and the surface charge density was as sufficiently low as $-1.3 \times 10^{11}/cm^2$.

EXAMPLE 2

The microwave plasma processing apparatus shown in FIG. 12 was used to carry out ashing of a photoresist.

The article to be processed W was an 8-inch silicon wafer immediately after a layer insulation film exposed via a photoresist pattern was etched to form via holes. First, the Si wafer was put on the holding means 102, and the inside of the plasma generation chamber 109 was evacuated via the exhaust system (24 to 26) to reduce the pressure down to $10^{-5}$ Torr. Oxygen gas was introduced at a flow rate of 2 slm into the chamber via the plasma processing gas supply means 107. Then, the conductance valve 26 provided in the exhaust system (24 to 26) was adjusted to maintain the inside of the generation chamber 109 at 2 Torr. The microwave power source 6 was used to introduce a microwave power of 2.45 GHz and 1.5 kW to the planar slotted annular waveguide 103 in the tangential direction. Thus, microwaves were radiated from the slots 103b to generate a plasma in the chamber 109. At this time, the oxygen gas introduced via the plasma processing gas supply port 107 was excited, decomposed, and reacted in the plasma generation chamber 109 to form ozone, which was then transported toward the Si wafer W to oxidize the photoresist on the surface of the Si wafer. Thus, the oxidized photoresist was vaporized and removed. After ashing, the ashing speed and the charge density on the surface of the wafer were evaluated.

The ashing speed obtained was as very high as 8.9 $\mu$m/min ±9.4%, and the surface charge density was as sufficiently low as $-1.4 \times 10^{11}/cm^2$.

EXAMPLE 3

The microwave plasma processing apparatus shown in FIG. 11 was used to form a silicon nitride film serving to protect a semiconductor element.

The article to be processed W was a P-type single crystal silicon substrate (face orientation <100>; resistivity: 10 $\Omega$cm) with a layer insulation film on which an Al wiring pattern of lines and spaces of 0.5 $\mu$m in width and 0.5 $\mu$m in pitch was formed. First, the silicon substrate W was put on the holding means 102, and the inside of the plasma generation chamber 109 was then evacuated via the exhaust system (24 to 26) to reduce the pressure down to $10^{-7}$ Torr. Subsequently, the heater 114 was energized to heat the silicon substrate W to 300° C., and the substrate was maintained at this temperature. Nitrogen gas at a flow rate of 600 sccm and monosilane gas at a flow rate of 200 sccm were introduced into the chamber via the plasma processing gas supply means 107. Then, the conductance valve 26 provided in the exhaust system (24 to 26) was adjusted to maintain the inside of the chamber at 20 mTorr. Subsequently, the microwave power source 6 was used to introduce a microwave power of 2.45 GHz and 3.0 kW into the planar slotted annular waveguide 103 in the $TM_{10}$ mode. Thus, a plasma was generated in the plasma generation chamber 109. At this time, the nitrogen gas introduced via the plasma processing gas supply port 107 was excited and decomposed in the plasma generation chamber 109 to form an active species, which was then transported toward the silicon substrate W to react with the monosilane gas, thereby forming a silicon nitride film in 1.0 μm thickness on the surface of the silicon substrate W. After the film has been formed, the film formation speed and the film quality such as stress were evaluated. For the stress, the change in the amount of the warpage of the substrate was measured before and after the film formation using a laser interferometer Zygo (trade name).

The formation speed of the silicon nitride film obtained was very large, 540 nm/min., and with respect to the film quality, the stress was $1.1 \times 10^9$ dyne/cm$^2$ (compression), the leak current was $1.2 \times 10^{-10}$ A/cm$^2$, and the dielectric strength was 9 MV/cm, and the film was therefore confirmed to be very excellent.

EXAMPLE 4

The microwave plasma processing apparatus shown in FIG. 12 was used to form a silicon oxide and a silicon nitride films serving as an anti-reflection film for a plastic lens.

The article to be processed W was a plastic convex lens of a diameter 50 mm. First, the lens was put on the holding means 102, and the inside of the plasma generation chamber 109 was evacuated via the exhaust system (24 to 26) to reduce the pressure down to $10^{-7}$ Torr. Nitrogen gas at a flow rate of 150 sccm and monosilane gas at a flow rate of 100 sccm were introduced into the chamber via the plasma processing gas supply means 107. Then, the conductance valve 26 provided in the exhaust system (24 to 26) was adjusted to maintain the inside of the chamber at 5 mTorr. Subsequently, the microwave power source 6 was used to introduce a microwave power of 2.45 GHz and 3.0 kW into the planar slotted annular waveguide 103 in the tangential direction. Thus, the microwaves were radiated through the slots to generate a plasma in the chamber 109. At this time, the nitrogen gas introduced via the plasma processing gas supply port 107 was excited and decomposed in the chamber to form an active species such as nitrogen atoms, which was then transported toward the lens W to react with the monosilane gas, thereby forming a silicon nitride film in a 21 nm thickness on the surface of the lens W.

Next, oxygen gas at a flow rate of 200 sccm and monosilane gas at a flow rate of 100 sccm were introduced into the chamber via the plasma processing gas supply means 107. Then, the conductance valve 26 provided in the exhaust system (24 to 26) was adjusted to maintain the inside of the chamber at 1 mTorr. Subsequently, the microwave power source 6 was used to introduce a microwave power of 2.45 GHz and 2.0 kW into the planar slotted annular waveguide 103 in the tangential direction. Thus, a plasma was generated in the plasma generation chamber. At this time, the oxygen gas introduced via the plasma processing gas supply port 107 was excited and decomposed in the plasma generation chamber 109 to form an active species such as oxygen atoms, which was then transported toward the lens W to react with the monosilane gas, thereby forming a silicon oxide film in a 86 nm thickness on the surface of the lens W.

After the films have been formed, the film formation speed and the reflection characteristic were evaluated.

The formation speeds of the silicon nitride and silicon oxide films as obtained were 300 nm/min and 360 nm/min, respectively, and with respect to the film quality, the reflectance at the vicinity of 500 nm was 0.03%, and the film was thus confirmed to have very excellent optical characteristics.

EXAMPLE 5

Figure 13:
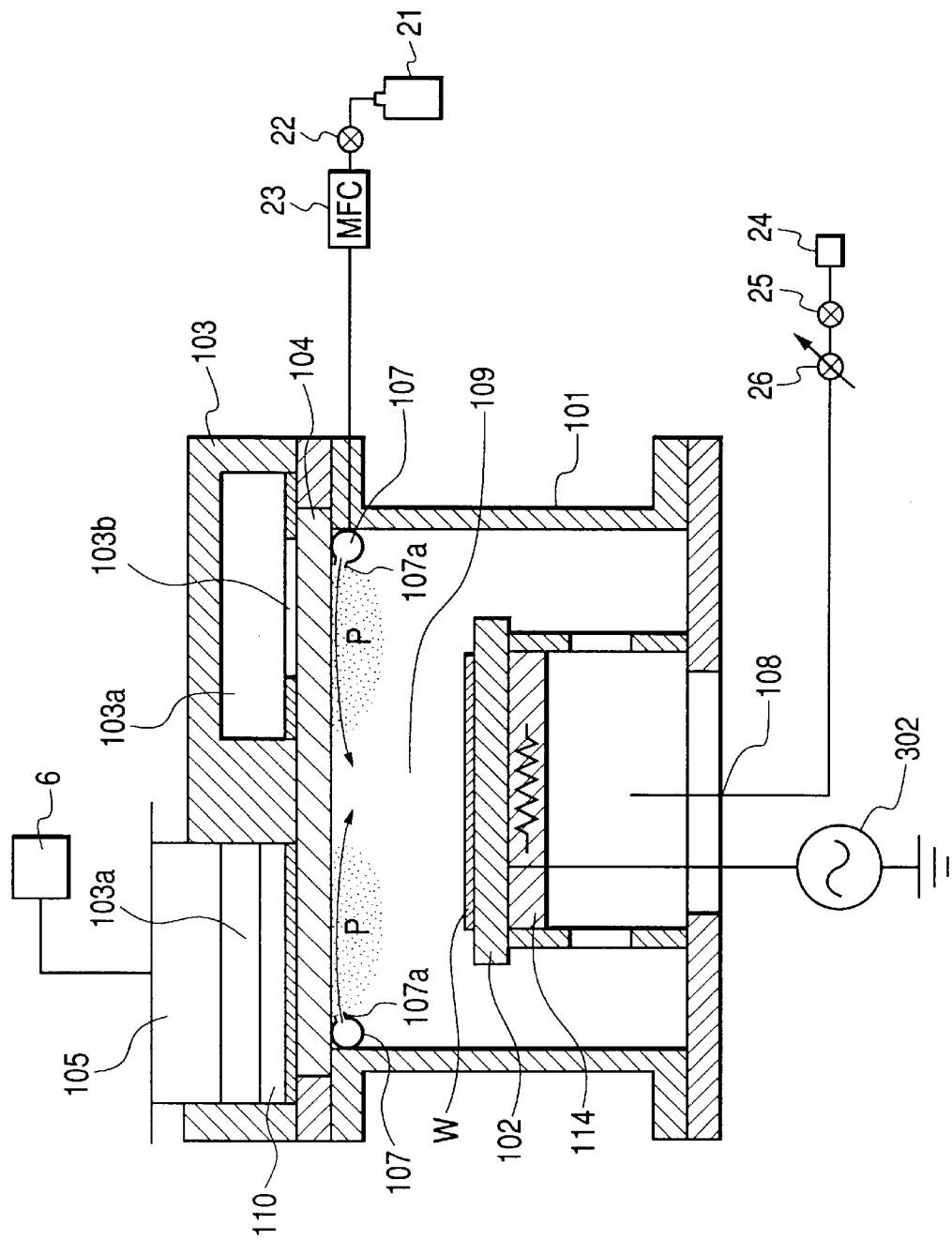
FIG. 13 is a schematic view showing yet another plasma processing apparatus according to this invention.

The microwave plasma processing apparatus shown in FIG. 13 was used to form a silicon oxide film for layer insulation of a semiconductor element.

The article to be processed W was a P-type single crystal silicon substrate (face orientation <100>; resistivity: 10 Ωcm) having formed on the top portion an Al pattern of lines and spaces of 0.5 μm in width and 0.5 μm in pitch. First, the silicon substrate W was put on the holding means 102. The inside of the plasma generation chamber 109 was then evacuated via the exhaust system (24 to 26) to reduce the pressure down to $10^{-7}$ Torr. Subsequently, the heater 114 was energized to heat the silicon substrate W to 300° C., and the substrate was maintained at this temperature. Oxygen gas at a flow rate of 500 sccm and monosilane gas at a flow rate of 200 sccm were introduced into the chamber via the plasma processing gas supply means 107. Then, the conductance valve 26 provided in the exhaust system (24 to 26) was adjusted to maintain the inside of the chamber at 30 mTorr. Subsequently, a high-frequency power of 13.56 MHz and 300 W was applied to the holding means 102, while the microwave power source 6 was used to introduce a microwave power of 2.45 GHz and 2.0 kW into the planar slotted annular waveguide 103 in the $TM_{10}$ mode. Thus, microwaves were radiated through the slots to generate a plasma in the plasma generation chamber 109. The oxygen gas introduced via the plasma processing gas supply port 107 was excited and decomposed in the plasma generation chamber 109 to form an active species, which was then transported toward the silicon substrate W to react with the monosilane gas, thereby forming a silicon oxide film in a 0.8 μm thickness on the surface of the silicon substrate W. At this time, ion species showed a function of being accelerated by the RF bias to be incident to the substrate and to cut the film on the pattern, thereby improving the flatness. After processing, the film formation speed, uniformity, dielectric strength, and step coverage were evaluated. The step coverage was evaluated by observing a cross section of the silicon oxide film formed on the Al wiring pattern by use of a scanning electron microscope (SEM) to check presence of voids.

The formation speed and uniformity of the silicon oxide film thus obtained was excellent as being 240 nm/min±2.5%, and with respect to the film quality, the dielectric strength was 8.5 MV/cm and no voids were found. Therefore, the film was confirmed to be excellent.

EXAMPLE 6

Figure 14:
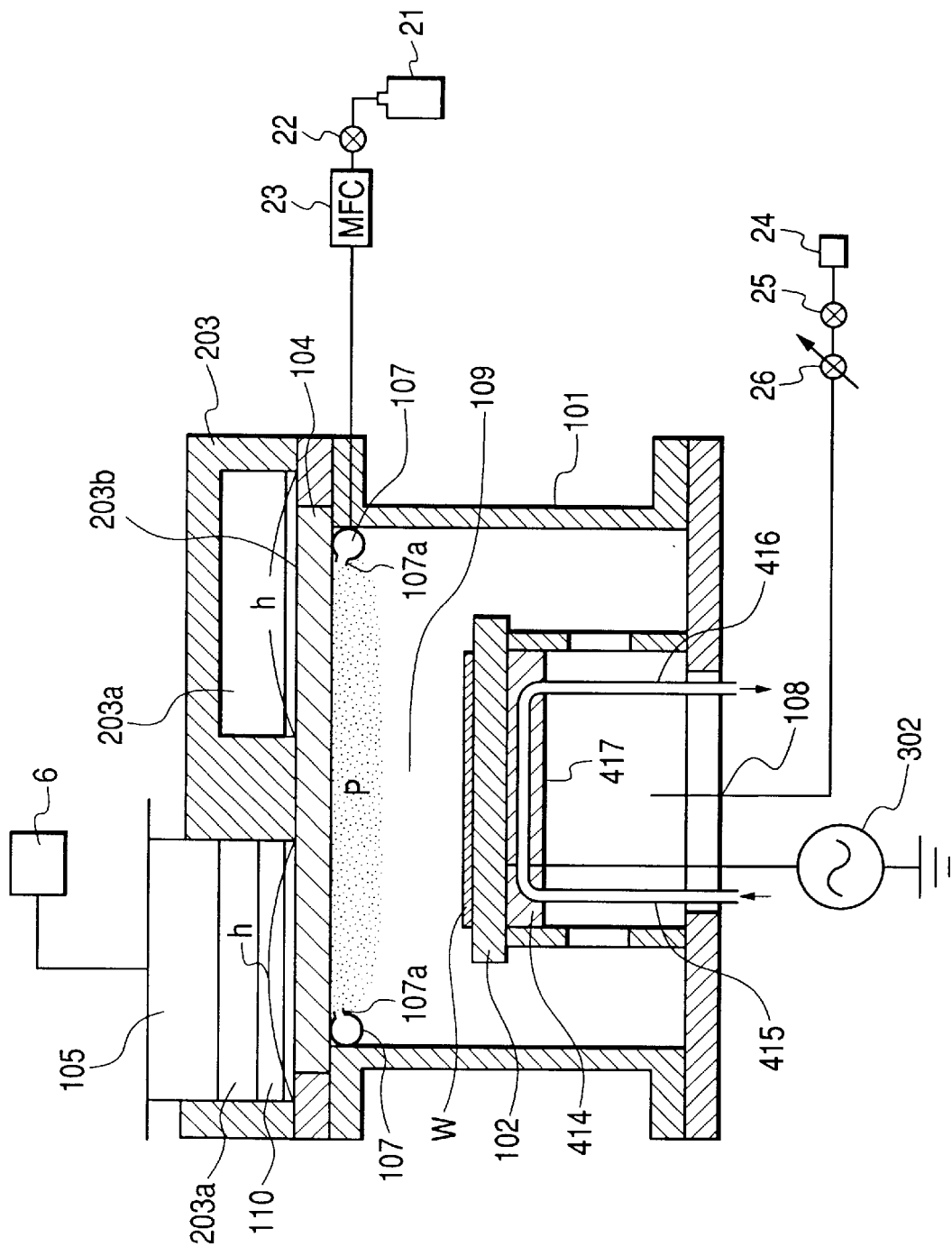
FIG. 14 is a schematic view showing yet still another plasma processing apparatus according to this invention.

The microwave plasma processing apparatus shown in FIG. 14 was used to etch a layer insulation film of a semiconductor element.

The article to be processed W was a P-type single crystal silicon substrate (face orientation <100>; resistivity: 10 Ωcm) in which a silicon oxide film of 1 μm in thickness was formed on an Al pattern having lines and spaces of 0.35 μm in width and 0.35 μm in pitch. First, the silicon substrate was put on the holding means 102, and the inside of the plasma generation chamber 109 was then evacuated via the exhaust system (24 to 26) to reduce the pressure down to $10^{-7}$ Torr. $CF_4$ gas at a flow rate of 300 sccm was introduced into the plasma generation chamber via the plasma processing gas supply means 107. Then, the conductance control valve 26 provided in the exhaust system (24 to 26) was adjusted to maintain the inside of the plasma generation chamber 109 at 5 mTorr. Subsequently, a high-frequency power of 13.56 MHz and 300 W was applied to the holding means 102, while the microwave power source 6 was used to introduce a microwave power of 2.45 GHz and 2.0 kW into the planar slotted annular waveguide 103 in the $TM_{10}$ mode. Thus, microwaves were radiated from the slots to generate a plasma in the plasma generation chamber 109. The $CF_4$ gas introduced via the plasma processing gas supply port 107 was excited and decomposed in the plasma generation chamber 109 to form an active species, which was then transported toward the silicon substrate W, where ions accelerated by a self bias etched the silicon oxide film. The cooler 414 prevented the temperature of the substrate from increasing above 90° C. After etching, the etch rate, etch selectivity, and etched shape were evaluated. The etched shape was evaluated by using a scanning electron microscope (SEM) to observe a cross section of the etched silicon oxide film.

The etch rate and the etch selectivity to polysilicon were excellent as being 600 nm/min and 20, respectively, and the etched shape was almost vertical, and the microloading effect was small.

EXAMPLE 7

The microwave plasma processing apparatus shown in FIG. 14 was used to etch a polysilicon film for a gate electrode of a semiconductor element.

The article to be processed W was a P-type single crystal silicon substrate (surface orientation <100>; resistivity: 10 Ωcm) in which a polysilicon film was formed at the top portion. First, the silicon substrate was put on the holding means 102, and the inside of the plasma generation chamber 109 was then evacuated via the exhaust system (24 to 26) to reduce the pressure down to $10^{-7}$ Torr. $CF_4$ gas at a flow rate of 300 sccm and oxygen gas at 20 sccm were introduced into the plasma generation chamber 109 via the plasma processing gas supply means 107. Then, the conductance control valve 26 provided in the exhaust system (24 to 26) was adjusted to maintain the inside of the plasma generation chamber 109 at 2 mTorr. Then, a high-frequency power of 400 kHz and 300 W was applied to the holding means 102, while the microwave power source 6 was used to introduce a microwave power of 2.45 GHz and 1.5 kW into the planar slotted annular waveguide 103 in the $TM_{10}$ mode. Thus, microwaves were radiated from the slots to generate a plasma in the plasma generation chamber 109. The $CF_4$ and oxygen introduced via the plasma processing gas supply port 107 were excited and decomposed in the plasma generation chamber 109 to form an active species, which was then transported toward the silicon substrate W, where ions accelerated by a self bias etched the polysilicon film. The cooler 414 prevented the temperature of the substrate from increasing above 80° C. After etching, the etch rate, etch selectivity, and etched shape were evaluated. The etched shape was evaluated using a scanning electron microscope (SEM) to observe a cross section of the etched polysilicon film.

The etch rate and the etch selectivity to $SiO_2$ were excellent as being 800 nm/min and 30, respectively, and the etched shape was vertical, and the micro-loading effect was small.

EXAMPLE 8

The plasma processing apparatus shown in FIG. 15 was used to carry out ashing of a photoresist using plasma as with Example 1. As a result, uniform ashing could be achieved in a short period of time without residues.

EXAMPLE 9

The microwave plasma processing apparatus shown in FIG. 20 was used to carry out ashing of a photoresist.

The article to be processed W was a silicon wafer (300 mm wafer) immediately after an $SiO_2$ film exposed via a photoresist pattern was etched to form via holes.

First, the Si wafer was put on the holding means 2, and the inside of the chamber was evacuated via the exhaust system (not shown) to reduce the pressure down to $10^{-5}$ Torr. Oxygen gas was introduced at a flow rate of 2 slm into the chamber via the plasma processing gas supply means 7.

Then, the conductance control valve (not shown) provided in the exhaust system (not shown) was adjusted to maintain the inside of the chamber at 2 Torr.

A 2.45-GHz microwave power source was used to supply a power of 2.0 kW to the inside of the chamber via the multiple endless annular waveguides 3, using the H branching device 56 the distribution rate of which was adjusted to attain 0.5 (inner side)/0.5 (outer side).

Thus, a plasma was generated in the chamber. At this time, the supplied oxygen gas was excited, decomposed, and reacted in the plasma generation chamber 9 to form ozone, which was then transported toward the silicon wafer W to oxidize the photoresist on the wafer. The oxidized photoresist was vaporized and removed. After ashing, the ashing speed and the charge density on the surface of the wafer were evaluated.

The ashing speed obtained was very large as 8.2 $\mu$m/min±7.2%, and the surface charge density was a sufficiently low value $1.3\times10^{11}/cm^2$.

EXAMPLE 10

The microwave plasma processing apparatus shown in FIG. 24 was used to carry out ashing of a photoresist.

As the article to be processed W, the same as in Example 9 was used.

First, the Si wafer was put on the holding means 102, and the inside of the plasma processing chamber was evacuated via the exhaust system (24 to 26) to reduce the pressure down to $10^{-5}$ Torr. Oxygen gas was introduced at a flow rate of 2 slm into the plasma processing chamber 109 via the plasma processing gas emission port 107a.

Then, the valve 26 provided in the exhaust system (24 to 26) was adjusted to maintain the inside of the chamber at 2 Torr. A 2.45 GHz microwave power source was used to supply a power of 2.0 kW to the inside of the plasma processing chamber via the multiple endless annular waveguides 103 in which the distribution rate is adjusted to 0.6 (inner side)/0.4 (outer side). Thus, a plasma was generated in the plasma processing chamber. At this time, the oxygen gas emitted via the plasma processing gas emission port 107a was excited, decomposed, and reacted in the plasma processing chamber to form ozone, which was then transported toward the silicon wafer to oxidize the photoresist on the silicon wafer W. The oxidized photoresist was vaporized and removed. After ashing, the ashing speed and the charge density on the surface of the substrate were evaluated.

The ashing speed obtained was very large as 8.6 µm/min ±7.8%, and the surface charge density was sufficiently small as $1.2\times10^{11}$/cm$^2$.

EXAMPLE 11

The microwave plasma processing apparatus shown in FIG. 20 was used to form a silicon nitride film serving to protect a semiconductor element.

The article to be processed W was a P-type single crystal silicon 300 mm wafer (face orientation <100>; resistivity: 10 Ωcm) with a layer insulation film having formed an Al of line and space pattern of 0.5 µm in width and 0.5 µm in pitch.

First, the silicon wafer was put on the holding means 102, and the inside of the plasma processing chamber was then evacuated via the exhaust system (not shown) to reduce the pressure down to $10^{-7}$ Torr. Subsequently, the heater 114 was energized to heat the silicon wafer to 300° C., and the substrate was maintained at this temperature. Nitrogen gas at a flow rate of 600 sccm and monosilane gas at 200 sccm were introduced into the processing chamber via the plasma processing gas emission port 7a.

Then, the conductance control valve (not shown) provided in the exhaust system (not shown) was adjusted to maintain the inside of the processing chamber at 20 mTorr.

Subsequently, a 2.45-GHz microwave power source was used to supply a power of 3.0 kW via the multiple endless annular waveguide 3 in which the distribution rate is adjusted to 0.45 (inner side)/0.55 (outer side).

Thus, a plasma was generated in the plasma processing chamber. At this time, the nitrogen gas introduced via the plasma processing gas emission port 7a was excited and decomposed in the plasma processing chamber to form an active species, which was then transported toward the silicon wafer to react with the monosilane gas, thereby forming a silicon nitride film of 1.0 µm in thickness on the surface of the silicon wafer. After the film has been formed, the film formation speed and the film quality such as the stress of the film were evaluated. For the stress, the amount of the warpage of the substrate was measured before and after the film formation using the laser interferometer called Zygo (trade name).

The formation speed of the silicon nitride film obtained was very large as being 540 nm/min, and with respect to the film quality, the stress was $1\times10^9$ dyne/cm$^2$ (compression), the leak current was $1.3\times10^{-10}$ A/cm$^2$, and the dielectric strength was 9.7 MV/cm. Therefore, this film was confirmed to be very excellent.

EXAMPLE 12

The microwave plasma processing apparatus shown in FIG. 24 was used to form a silicon oxide and a silicon nitride films as an anti-reflection film for a plastic lens.

The article to be processed W was a plastic convex lens of diameter 50 mm. First, the lens was put on the holding means 102, and the inside of the plasma processing chamber was evacuated via the exhaust system (24 to 26) to reduce the pressure down to $10^{-7}$ Torr. Nitrogen gas at a flow rate of 150 sccm and monosilane gas at 100 sccm were introduced into the chamber via the plasma processing gas emission port 107a.

Then, the valve 26 provided in the exhaust system (24 to 26) was adjusted to maintain the inside of the chamber at 5 mTorr. A 2.45-GHz microwave power source 6 was used to supply a power of 3.0 kW to the inside of the plasma processing chamber via the multiple endless annular waveguides 103 in which the distribution rate is adjusted to 0.7 (inner side)/0.3 (outer side).

Thus, a plasma was generated in the plasma processing chamber. At this time, the nitrogen gas introduced via the plasma processing gas emission port 107a was excited and decomposed in the plasma processing chamber to form an active species such as nitrogen atoms, which was then transported toward the lens to react with the monosilane gas, thereby forming a silicon nitride film of 21 nm in thickness on the lens.

Next, oxygen gas at a flow rate of 200 sccm and monosilane gas at 100 sccm were introduced into the processing chamber via the plasma processing gas emission ports 107. Then, the valve 26 provided in the exhaust system (24 to 26) was adjusted to maintain the inside of the processing chamber at 1 mTorr. The 2.45-GHz microwave power source 6 was used to supply a power of 2.0 kW to the inside of the plasma generation chamber via the multiple endless annular waveguides 103 in which the distribution rate is adjusted to 0.7 (inner side)/0.3 (outer side).

Thus, a plasma was generated in the plasma processing chamber. At this time, the oxygen gas introduced via the plasma processing gas supply port 107a was excited and decomposed in the plasma processing chamber to form an active species such as oxygen atoms, which was then transported toward the lens to react with the monosilane gas, thereby forming a silicon oxide film of 86 nm in thickness on the lens. After the films have been formed, the film formation speed and the reflection characteristics were evaluated.

The formation speeds of the silicon nitride and silicon oxide films obtained were 320 nm/min and 380 nm/min, respectively, and with respect to the film quality, the reflectance at near 500 nm was 0.25%. Therefore, the film was confirmed to have excellent optical characteristics.

EXAMPLE 13

The microwave plasma processing apparatus shown in FIG. 25 was used to form a silicon oxide film for layer insulation of a semiconductor element.

The article to be processed W was a 300 mm wafer of P-type single crystal silicon (face orientation <100>; resistivity: 10 Ωcm) having formed on the top portion an Al pattern (lines and spaces 0.5 µm).

First, the silicon wafer was put on the holding means 102. The inside of the plasma processing chamber was evacuated via the exhaust system (24 to 26) to reduce the pressure down to $10^{-7}$ Torr. Subsequently, the heater 114 was energized to heat the silicon wafer to 300° C., and the substrate was maintained at this temperature. Oxygen gas at a flow rate of 500 sccm and monosilane gas at 200 sccm were introduced into the processing chamber via the plasma processing gas emission port 107a.

Then, the valve 26 provided in the exhaust system (24 to 26) was adjusted to maintain the inside of the plasma processing chamber at 30 mTorr. Then, a power of 300 W was applied to the holding means 102 via the high-frequency application means for 13.56 MHz, while a 2.45-GHz microwave power source was used to supply a power of 2.0 kW to the inside of the plasma processing chamber via the multiple endless annular waveguides 103 in which the distribution rate is adjusted to 0.5 (inner side)/0.5 (outer side).

Thus, a plasma was generated in the plasma processing chamber. The oxygen gas introduced via the plasma processing gas supply port 107 was excited and decomposed in the plasma processing chamber to form an active species, which was then transported toward the silicon wafer to react with the monosilane gas, thereby forming a silicon oxide film of 0.8 µm in thickness on the surface of the silicon wafer.

At this time, ion species was accelerated by the RF bias to be incident to the substrate to cut the film on the pattern, thereby improving the flatness. After processing, the film formation speed, uniformity, dielectric strength, and step coverage were evaluated. The step coverage was evaluated by using a scanning electron microscope (SEM) to observe a cross section of the silicon oxide film formed on the Al wiring pattern to check the presence of voids.

The formation speed and uniformity of the silicon oxide film obtained was excellent as 270 nm/min ±2.3%, and with respect to the film quality, the dielectric strength was 9.3 MV/cm and no voids were found. Therefore, the film was confirmed to be excellent.

EXAMPLE 14

The microwave plasma processing apparatus shown in FIG. 26 was used to etch a layer insulation film of a semiconductor element.

The article to be processed W was a 300 mm wafer of P-type single crystal silicon (face orientation <100>; resistivity: 10 Ωcm) having formed an $SiO_2$ film as an layer insulation film on an Al pattern (lines and spaces 0.35 µm).

First, the silicon wafer was put on the holding means 102, and the inside of the plasma generation chamber was then evacuated via the exhaust system (24 to 26) to reduce the pressure down to $10^{-7}$ Torr. $CF_4$ was introduced at a flow rate of 300 sccm into the plasma processing chamber via the plasma processing gas emission port 107a. Then, the valve 26 provided in the exhaust system (24 to 26) was adjusted to maintain the inside of the plasma processing chamber at 5 mTorr.

Then, a power of 300 W was applied to the holding means 102 via the high-frequency application means 302 for 13.56 MHz, while the 2.45-GHz microwave power source 6 was used to supply a power of 2.0 kW to the inside of the plasma processing chamber via the multiple endless annular waveguide 103 in which the distribution rate is adjusted to 0.4 (inner side)/0.6 (outer side). Thus, a plasma was generated in the plasma processing chamber.

The $CF_4$ introduced via the plasma processing gas emission port 107a was excited and decomposed in the plasma processing chamber to form an active species, which was then transported toward the silicon wafer, where ions accelerated by the self bias etched the silicon oxide film. The cooler 414 prevented the temperature of the substrate from increasing above 90° C. After etching, the etch rate, etch selectivity, and etched shape were evaluated. The etched shape was evaluated by using a scanning electron microscope (SEM) to observe a cross section of the etched silicon oxide film.

The etch rate and the etch selectivity to polysilicon were excellent as 690 nm/min and 21, respectively, and the etched shape was almost vertical, and the microloading effect was small.

EXAMPLE 15

The microwave plasma processing apparatus shown in FIG. 26 was used to etch a polysilicon film for gate electrodes of a semiconductor element.

The article to be processed was a 300 mm wafer of P-type single crystal silicon (face orientation <100>; resistivity: 10 Ωcm) having a polysilicon film formed at the top portion.

First, the silicon wafer was put on the holding means 102, and the inside of the plasma processing chamber was then evacuated via the exhaust system (24 to 26) to reduce the pressure down to $10^{-7}$ Torr. $CF_4$ gas at a flow rate of 300 sccm and oxygen at 20 sccm were introduced into the plasma processing chamber via the plasma processing gas emission port 107a.

Then, the valve 26 provided in the exhaust system (24 to 26) was adjusted to maintain the inside of the plasma processing chamber at 2 mTorr. Then, a high-frequency power of 400 kHz and 300 W was applied to the wafer via the RF bias application means 302, while the 2.45-GHz microwave power source 6 was used to supply a power of 1.5 kW to the inside of the plasma processing chamber via the multiple endless annular waveguide 103 in which the distribution rate is adjusted to 0.45 (inner side)/0.55 (outer side).

Thus, a plasma was generated in the plasma processing chamber. The $CF_4$ gas and oxygen introduced via the plasma processing gas emission port 107a were excited and decomposed in the plasma processing chamber to form an active species, which was then transported toward the silicon wafer, where ions accelerated by the self bias etched the polysilicon film. The cooler 414 prevented the temperature of the wafer from increasing above 80° C.

After etching, the etching rate, etch selectivity, and etched shape were evaluated. The etched shape was evaluated by using a scanning electron microscope (SEM) to observe a cross section of the etched polysilicon film.

The etch rate and the etch selectivity to $SiO_2$ were excellent as being 870 nm/min and 26, respectively, and it is confirmed that the etched shape was vertical, and the microloading effect was small.

EXAMPLE 16

The apparatus shown in FIG. 27 was used to carry out ashing of a photoresist as with Example 9.

As a result, uniform processing could be carried out in a short period of time without residues.

According to the present invention, since the direction of the gas emission port is defined in combination with the configuration of the microwave applicator, a uniform, large-diameter, low-temperature plasma can be generated even at a relatively high pressure, whereby an article of a large area equivalent to a 200 mm wafer or more can be processed satisfactorily.

Further, according to another aspect of the present invention, by forming the microwave applicator of a builtup member having an exchangeable slot plate therein, it is possible to provide a low-cost, highly universal microwave applicator.

In addition, according to yet another aspect of the present invention, since a plurality of annular waveguides are arranged concentrically such that the slotted H-planes thereof are coplanar to each other, it is possible to radiate and supply microwaves having a uniform and large-area intensity distribution. Thus, a large-are article to be processed which is equivalent to a 300 mm wafer or more can be plasma-processed satisfactorily.

What is claimed is:

1. A plasma processing apparatus comprising:
a container which can be evacuated;
a gas supply means for supplying a gas to the inside of the container; and
a microwave supply means for supplying microwaves to generate a plasma in the container, the plasma being utilized to process an article,
wherein the microwave supply means is a microwave applicator which is provided with an endless annular waveguide having a planar H-plane with a plurality of slots provided apart from each other and a rectangular cross section perpendicular to the traveling direction of microwaves in the waveguide and which supplies microwaves to the inside of the container through a dielectric window of the container from the plurality of slots provided in the planar H-plane, and
wherein the gas supply means is provided below the planar H-plane with a gas emission port that directs the gas to a surface of the planar H-plane, and,
wherein a microwave introducing port for the endless annular waveguide is provided in another H-plane, and wherein a means is provided at an introducing section, for distributing the microwaves in two directions parallel to the H-plane and propagating the microwaves in both directions within the annular waveguide.

2. The plasma processing apparatus according to claim 1, comprising means for generating a magnetic field having a magnetic flux density of about $3.57 \times 10^{-11}$ (T/Hz) times the frequency of the microwaves, in the vicinity of the plurality of slots.

3. A plasma processing apparatus comprising:
a container which can be evacuated, said container having a plate-like shaped dielectric window;
a microwave applicator that supplies microwaves of the same mode to generate, in said container, a plasma utilized to process an article, said microwave applicator having a plurality of concentrically disposed endless annular waveguides each having (i) a planar H-plane with a plurality of slots spaced apart from each other, the planar H-planes of the plurality of endless annular waveguides being in one plane, (ii) a rectangular cross section perpendicular to the traveling direction of microwaves, the microwaves supplied from the plurality of slots to the inside of said container through the dielectric window, the plate-like shape of the dielectric window being common to the plurality of endless annular waveguides, and (iii) different circumferential lengths; and
a gas supply means for supplying a gas to the inside of the container,
wherein a microwave introducing port for the plurality of annular waveguides is provided with an H branch that determines the distribution ratio of the microwaves to each waveguide.

4. The plasma processing apparatus according to claim 3, wherein microwaves of $TE_{10}$ mode are supplied to each of the plurality of annular waveguides through a rectangular waveguide connected thereto.

5. The plasma processing apparatus according to claim 3, wherein the plurality of annular waveguides are formed of an assembly comprising a conductive member in which a plurality of annular recessed portions and microwave introducing ports are formed; and a plate-like conductive member in which the plurality of slots are formed.

6. The plasma processing apparatus according to claim 3, wherein the dielectric window is provided adjacent to the planar H-plane.

7. The plasma processing apparatus according to claim 3, comprising a holding means for holding a plate-like article to be processed in parallel to the planar H-plane.

8. The plasma processing apparatus according to claim 3, wherein a plurality of gas emission ports are provided apart from each other so as to surround a plasma generation space.

9. The plasma processing apparatus according to claim 3, wherein a gas emission port is provided in communication with a gas emission passage formed at an angle so as to be inclined with regard to the planar H-plane.

10. The plasma processing apparatus according to claim 3, wherein a plurality of gas emission ports are provided in the vicinity of the dielectric window such that the gap between the gas emission ports and the dielectric window in the direction normal to the planar H-plane is smaller than the gap between the gas emission ports and the article to be processed in the direction normal to the planar H-plane.

11. The plasma processing apparatus according to claim 3, wherein a gas emission port is located outside and above the to-be-processed surface of the article to be processed.

12. The plasma processing apparatus according to claim 3, wherein the circumferential length of a ring formed by connecting the centers of each of the annular waveguides together is an integral multiple of the guide wavelength, and wherein the slots are radially formed at an interval of at least ½ of the guide wavelength along the ring.

13. The plasma processing apparatus according to claim 3, wherein the length of the slot perpendicular to the traveling direction of the microwaves is within a range of ¼ to ⅜ of the guide wavelength.

14. The plasma processing apparatus according to claim 3, comprising a holding means for holding the article to be processed at a position isolated from the plasma generation space in the container.

15. The plasma processing apparatus according to claim 3, comprising a holding means for holding the article to be processed having means for applying a high-frequency bias.

16. The plasma processing apparatus according to claim 3, comprising in the vicinity of a microwave introducing port, a diaphragm and means for tilting the diaphragm.

17. The plasma processing apparatus according to claim 3, comprising in the vicinity of a microwave introducing port, a diaphragm and means for stretching and contracting the diaphragm.

18. The plasma processing apparatus according to claim 3, wherein microwaves having a power sufficient for one or more rounds of propagation through the annular waveguide are supplied to each annular waveguide.

19. The plasma processing apparatus according to claim 3, wherein the power of the microwaves is a power sufficient for two or more rounds of propagation through each annular waveguide.

20. The plasma processing apparatus according to claim 3, wherein each annular waveguide has such a circumferential length as to allow standing waves to be generated therein.

21. The plasma processing apparatus according to claim 3, wherein the inside of the container is kept at a pressure not less than 13.3 Pa and not more than 1300 Pa during processing.

22. The plasma processing apparatus according to claim 3, which is an ashing apparatus.

23. The plasma processing apparatus according to claim 3, wherein a plurality of gas emission ports are provided such that the interval via the center between a pair of opposed gas emission ports in the direction parallel to the planar H-plane is larger than the diameter or side length of the article to be processed.

24. The plasma processing apparatus according to claim 23, wherein the diameter or side length of the article to be processed is smaller than the interval via the center between the outer ends of the plurality of slots of the outermost annular waveguide.

25. A plasma processing apparatus comprising:

a container which can be evacuated;

a gas supply means for supplying a gas to the inside of the container; and a microwave supply means for supplying microwaves to generate a plasma in the container, the plasma being utilized to process an article, wherein the microwave supply means is a microwave applicator which is provided concentrically with a plurality of endless annular waveguides each having a planar H-plane with a plurality of slots provided apart from each other and a rectangular cross section perpendicular to the traveling direction of microwaves and which supplies microwaves to the inside of the container through a dielectric window of the container from the plurality of slots provided in the planar H-plane of each of the plurality of endless annular waveguides, the plurality of endless annular waveguides having different circumferential lengths and the planar H-planes of the plurality of endless annular waveguides being in one flat plane, wherein a microwave introducing port for the annular waveguide is provided in another H-plane, and wherein an introducing section is provided with means for distributing the microwaves in two directions parallel to the H-plane and propagating the microwaves in the both directions within each of the annular waveguides.

26. The plasma processing apparatus according to claim 25, comprising means for generating a magnetic field having a magnetic flux density of about $3.57 \times 10^{-11}$(T/Hz) times the frequency of the microwaves, in the vicinity of the slots.

* * * * *

UNITED STATES PATENT AND TRADEMARK OFFICE
CERTIFICATE OF CORRECTION

PATENT NO. : 6,497,783 B1
DATED : December 24, 2002
INVENTOR(S) : Nobumasa Suzuki et al.

It is certified that error appears in the above-identified patent and that said Letters Patent is hereby corrected as shown below:

Column 2,
Line 2, "a" should read -- an --.

Column 6,
Line 45, "reduced.;" should read -- reduced. --.

Column 15,
Line 23, "used to" should read -- used in --.

Column 16,
Line 40, "cross" should read -- crosses --.
Line 45, "accelerate" should read -- accelerates --.
Line 59, "the is" should read -- the slots is --.

Column 21,
Line 58, "an planar" should read -- a planar --.

Column 26,
Line 30, "diameter.2" should read -- diameter. --.

Column 35,
Line 53, "films" should read -- film --.

Column 38,
Line 65, "large-are" should read -- large area --.

Signed and Sealed this

First Day of June, 2004

JON W. DUDAS
*Acting Director of the United States Patent and Trademark Office*